(12) United States Patent
Chiu et al.

(10) Patent No.: US 12,707,794 B2
(45) Date of Patent: Aug. 11, 2026

(54) SEMICONDUCTOR DEVICES AND METHODS OF MANUFACTURE

(71) Applicants: TAIWAN SEMICONDUCTOR MANUFACTURING COMPANY, LTD., Hsinchu (TW); National Yang Ming Chiao Tung University, Hsinchu City (TW)

(72) Inventors: Hsin-Yuan Chiu, Kaohsiung City (TW); Tzu-Ang Chao, Hsinchu (TW); Gregory Michael Pitner, Sunnyvale, CA (US); Matthias Passlack, Hayward, CA (US); Chao-Hsin Chien, Hsinchu City (TW); Han Wang, San Jose, CA (US)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 543 days.

(21) Appl. No.: 18/336,829

(22) Filed: Jun. 16, 2023

(65) Prior Publication Data

US 2024/0422998 A1 Dec. 19, 2024

(51) Int. Cl.

| | |
|---|---|
| ***H10K 10/84*** | (2023.01) |
| ***H10K 10/46*** | (2023.01) |
| *H10K 85/20* | (2023.01) |
| *H10K 102/20* | (2023.01) |

(52) U.S. Cl.
CPC ........... *H10K 10/84* (2023.02); *H10K 10/464* (2023.02); *H10K 10/484* (2023.02); *H10K 85/221* (2023.02); *H10K 2102/20* (2023.02)

(58) Field of Classification Search
CPC .. H10K 10/84; H10K 10/464; H10K 2102/20; H10K 85/221; H10K 10/484
See application file for complete search history.

(56) References Cited

U.S. PATENT DOCUMENTS

2007/0102747 A1* 5/2007 Chen .................... H10K 10/481
257/314

OTHER PUBLICATIONS

Gotthardt et al., “Molecular n-Doping of Large- and Small-Diameter Carbon Nanotube Field-Effect Transistors with Tetrakis(tetramethylguanidino)benzene,” ACS Applied Electronic Materials, vol. 3, 2021, pp. 804-812.

* cited by examiner

*Primary Examiner* — Victor A Mandala
*Assistant Examiner* — Colleen E Snow
(74) *Attorney, Agent, or Firm* — Birch, Stewart, Kolasch & Birch, LLP

(57) ABSTRACT

A device includes a carbon nanotube having a channel region and dopant-free source/drain regions at opposite sides of the channel region, a first metal oxide layer interfacing a first one of the dopant-free source/drain regions of the carbon nanotube, a second metal oxide layer interfacing a second one of the dopant-free source/drain regions of the carbon nanotube and a gate structure over the channel region of the carbon nanotube, and laterally between the first metal oxide layer and the second metal oxide layer.

20 Claims, 34 Drawing Sheets

SEMICONDUCTOR DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As feature size continues to shrink in semiconductor manufacturing process, more challenges arise that need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
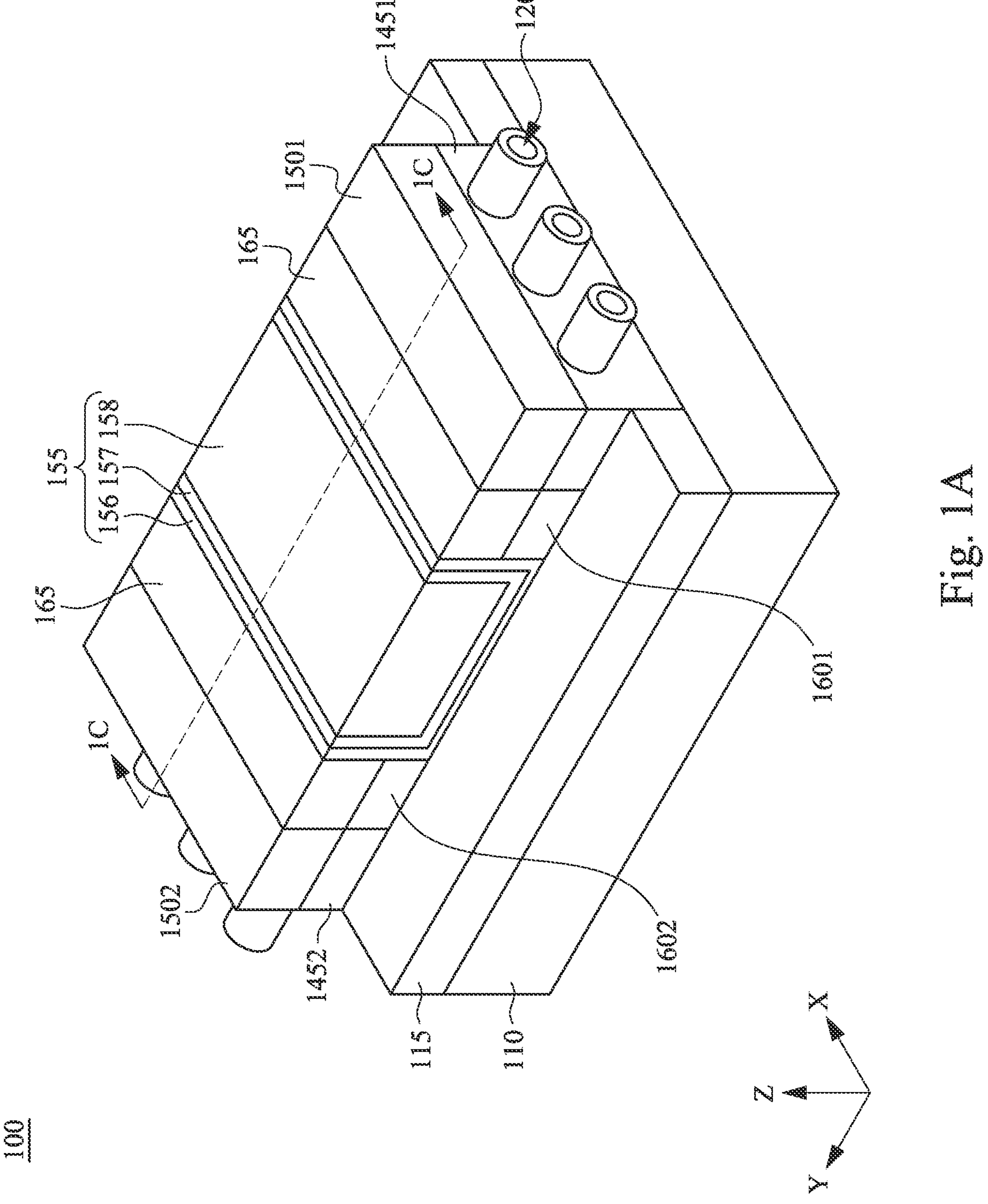
FIGS. 1A, 1B and 1C illustrate a perspective view, a side view and a cross-section view of a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For silicon-based device, ion implantation was adopted to tune the Fermi level at source/drain regions. However, the method may not be suitable for carbon nanotube (CNT) FET. Strong implant energy may harm CNT and destroy transportation property of CNT. In other words, the CNT may be damaged by a strong ion implantation. In the other hand, weak ion implantation could not provide enough doping effect. Therefore, embodiments of the present disclosure address the foregoing drawbacks by developing an implantation-free method for forming source/drain regions of CNTFET. In particular, the implantation-free method employs particular metal oxide layers interfacing with source/drain regions of the CNTs. Materials of the metal oxide layers are selected such that valence band edge and/or conduction band edge at the source/drain regions of the CNTs will shift, when they are in contact with the CNTs. Shifting in the valence band edge and/or conduction band edge of CNTs allows for the Fermi level of CNTs getting closer to the valence band or the conduction band, which in turn equivalently form p-type doped source/drain regions or n-typed doped source/drain regions in CNTs. For example, when the metal oxide layers shift the valence band edge and/or conduction band edge of source/drain regions of CNTs upwards in the band diagram, the Fermi level of source/drain regions of CNTs will be closer to the valence band, and thus the dominant carriers will be holes, allowing the source/drain regions to act as "p-type" doped regions. When the metal oxide layers shift the valence band edge and/or conduction band edge of source/drain regions of CNTs downwards in the band diagram, the Fermi level of source/drain regions of CNTs will be closer to the conduction band, and thus the dominant carriers will be electrons, allowing the source/drain regions to act as "n-type" doped regions. When the metal oxide layers are in contact with CNTs, the metal oxide layers contribute to a p-type doped behavior or an n-type doped behavior in the source/drain regions of CNTs, and thus the metal oxide layers can be interchangeably referred to as "contact doping layers" in this context. Moreover, because the metal oxide layers induce the band-edge shifting in the source/drain regions of CNTs, the metal oxide layers can also be interchangeably referred to as "band-edge shift inducing layers" in this context.

Figure 1C:
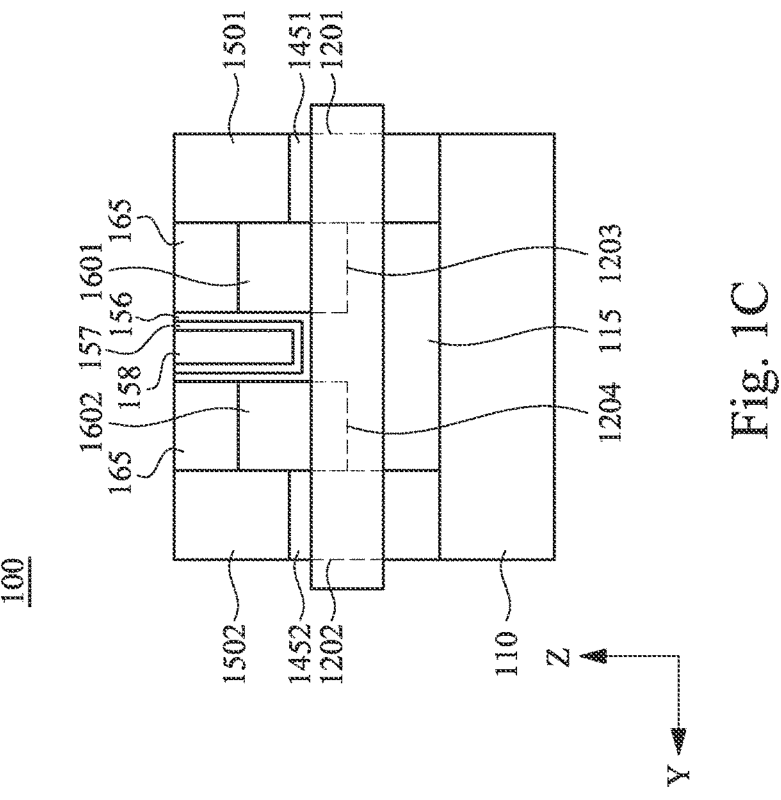
Figure 1B:
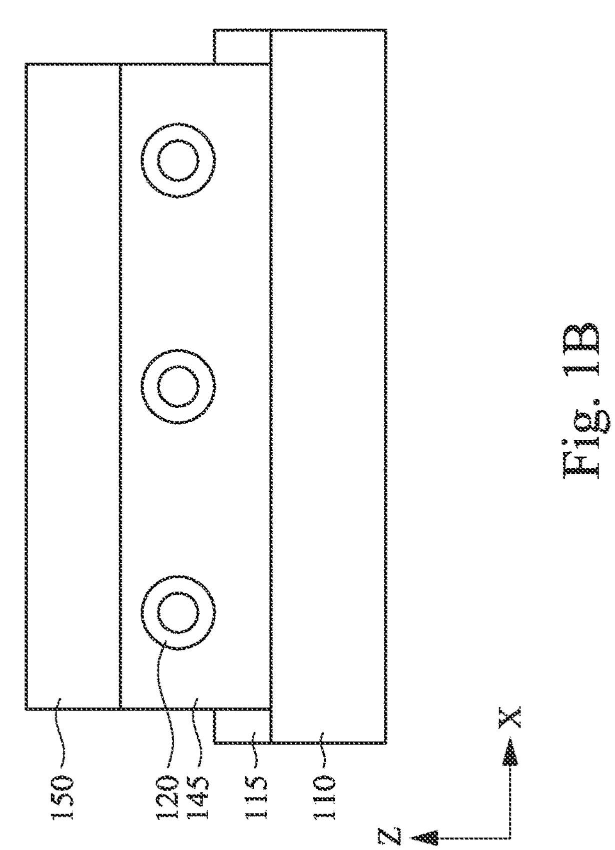

Reference is made to FIGS. 1A, 1B and 1C. FIGS. 1A, 1B and 1C illustrate a perspective view, a side view and a cross-section view of a device 100 in accordance with some embodiments. According to one or more embodiments of the present disclosure, a device 100 includes a substrate 110, an interlayer dielectric layer 115, an array of carbon nanotubes (CNTs) 120 each having first source/drain regions 1201 and second source/drain regions 1202, band-edge shift inducing layers 1451 and 1452 respectively over the first source/drain regions 1201 and the second source/drain regions 1202, source/drain contact layers 1501 and 1502 respectively located over the band-edge shift inducing layers 1451 and 1452, a gate structure 155 formed over channel regions 1205 of the CNTs 120 and having gate dielectric layers 156, 157 and gate electrode 158, auxiliary band-edge shift inducing layers 1601 and 1602 and an interlayer dielectric layer 165 over the auxiliary band-edge shift inducing layers 1601 and 1602. The CNTs 120 are located on the substrate 110 and extend in a direction y. Each CNT 120 has the first source/drain region 1201 and the second source/drain region 1202 opposite to the first source/drain region 1201 in the direction y. Each CNT 120 further has a source/drain extension region 1203 under the auxiliary band-edge shift inducing layer 1601 and a source/drain extension region 1204 under the auxiliary band-edge shift inducing layer 1602.

As illustrated in FIGS. 1A, 1B and 1C, in one or more embodiments of the present disclosure, the band-edge shift inducing layer 1451 is over the first source/drain regions 1201 of the CNTs 120 and surrounds the first source/drain regions 1201 of the CNTs 120. The band-edge shift inducing layer 1452 is over the second source/drain regions 1202 of the CNTs 120 and surrounds the second source/drain regions 1202 of the second source/drain regions 1202. The band-edge shift inducing layers 1451 and 1452 extend to the top surface of the substrate 110 through the interlayer dielectric layer 115. The band-edge shift inducing layers 1451 and 1452 serve to induce a p-type doped behavior (i.e., with holes as dominant carriers) or an n-type doped behavior (i.e., with electrons as dominant carriers) in the source/drain regions 1201, 1202, without implanting dopant ions or impurities into the source/drain regions 1201, 1202 of CNTs. Therefore, the CNTs 120 have dopant-free source/drain regions 1201, 1202. The source/drain contact layer 1501 is over the first source/drain regions 1201 of the CNTs 120 and over the band-edge shift inducing layer 1451. The source/drain contact layer 1502 is over the second source/drain regions 1202 of the CNTs 120 and over the second doping layer 1452.

As shown in FIGS. 1A, 1B and 1C, the gate structure 155 is over the CNTs 120 and between the first source/drain regions 1201 and the second source/drain regions 1202 of the CNTs 120. The gate dielectric layer 156 is in contact with the CNTs 120. The gate dielectric layer 156 has a bottom surface level with the top surface of the interlayer dielectric layer 115. In the embodiment as illustrated in FIGS. 1A, 1B and 1C of the present disclosure, the bottom surface of the gate dielectric layer 156 is lower than the top surfaces of the band-edge shift inducing layers 1451 and 1452. The gate dielectric layer 157 is over the gate dielectric layer 156. The gate electrode 158 is over the gate dielectric layer 157 and separated from the CNTs 120 by the gate dielectric layers 156 and 157.

In the embodiment as illustrated in FIGS. 1A, 1B and 1C of the present disclosure, the auxiliary band-edge shift inducing layer 1601 is located between the gate structure 155 and the first source/drain regions 1201 of the CNTs 120, and the auxiliary band-edge shift inducing layer 1602 is located between the gate structure 155 and the second source/drain regions 1202 of the CNTs 120. The auxiliary band-edge shift inducing layer 1601 has a top surface higher than the top surface of the band-edge shift inducing layer 1451 and a bottom surface lower than the top surface of the band-edge shift inducing layer 1451. The auxiliary band-edge shift inducing layer 1602 has a top surface higher than the top surface of the band-edge shift inducing layer 1452 and a bottom surface lower than the top surface of the band-edge shift inducing layer 1452. The auxiliary band-edge shift inducing layers 1601 and 1602 are in contact with source/drain extension regions 1203/1204 of the CNTs 120, and formed of materials capable of shifting valence band edge and/or conduction band edge of source/drain extension regions 1203/1204 of CNTs 120. In some embodiments where the source/drain regions 1201/1202 have p-type doped behaviors (i.e., with holes as dominant carriers) induced by the band-edge shift inducing layers 1451/1452, materials of the auxiliary band-edge shift inducing layers 1601 and 1602 are selected such that the source/drain extension regions 1203/1204 have p-type doped behaviors. In some embodiments where the source/drain regions 1201/1202 have n-type doped behaviors (i.e., with electrons as dominant carriers) induced by the band-edge shift inducing layers 1451/1452, materials of the auxiliary band-edge shift inducing layers 1601 and 1602 are selected such that the source/drain extension regions 1203/1204 have n-type doped behaviors. The interlayer dielectric layer 165 is formed over the auxiliary band-edge shift inducing layers 1601 and 1602.

As shown in FIG. 1C, in direction z, a depth of the source/drain extension regions 1203 is less than a depth of the source/drain region 1201 and a depth of the source/drain extension regions 1204 is less than a depth of the source/drain region 1204. The depths of the source/drain extension regions 1203 and 1204 are less than the depths of the source/drain regions 1201 and 1202 since the band-edge shift inducing layers 1451 and 1452 over the source/drain regions 1201 and 1202 surround the CNTs 120 and the auxiliary band-edge shift inducing layers 1601 and 1602 over the source/drain extension regions 1203 and 1204 are at the topside of the CNTs 120. In other words the interface area between the band-edge shift inducing layers 1451, 1452 and the source/drain regions 1201, 1202 is larger than an interface area between the auxiliary band-edge shift inducing layers 1601, 1602, and the source/drain extension regions 1203, 1204.

In one or more embodiments of the present disclosure, the substrate 110 may be a support material such as a silicon material (e.g., a silicon wafer), a germanium material, a silicon germanium material, a gallium arsenide material, although other substrates, such as semiconductor-on-insulator (SOI), strained SOI, silicon germanium on insulator, glass substrate, combinations of these, or the like. However, any suitable material may be used for the substrate 110.

The interlayer dielectric layer 115 is located over the substrate 110 and is utilized to isolate devices subsequently formed on the substrate 110. The interlayer dielectric layer 165 is over the auxiliary band-edge shift inducing layers 1601 and 1602. In one or more embodiments of the present disclosure, the interlayer dielectric layers 115 and 165 can be oxide or nitride. In some embodiments, the interlayer dielectric layers 115 and 165 are dielectric material such as silicon oxide ($SiO_2$), hafnium oxide ($HfO_2$), aluminum oxide ($Al_2O_3$), silicon nitride ($Al_2O_3$), α-boron nitride (α-BN) and/or combinations of these, or the like deposited onto the substrate 110 using a deposition process such as chemical vapor deposition, sputtering, atomic layer deposition, combinations of these, or the like.

In one or more embodiments of the present disclosure, the CNTs 120 are single-walled carbon nanotubes, wherein each single-walled carbon nanotube is formed by a single layer of carbon. In some embodiments, a thickness of one of the CNTs 120 is in a range from about 0 Å to tens Å. A height of a bottom side of each CNT 120 is aligned with a top surface of the interlayer dielectric layer 115.

In one or more embodiments the CNTs 120 may be single-walled carbon nanotubes formed using any suitable method, such as a carbon arc discharge method (with subsequent purification), a laser vaporization method, a catalyzed chemical vapor deposition, ball milling and subsequent annealing, diffusion flame syntheses, electrolysis, heat treatment of a polymer, low-temperature solid pyrolysis, combinations of these, or the like. However, any suitable method of manufacturing the CNTs 120 may be utilized, and all such methods are fully intended to be included within the scope of the embodiments.

As shown in FIGS. 1A, 1B and 1C, the CNTs 120 extend in direction y, arranged in parallel in direction x and form a CNT array. FIG. 1C illustrates a cross-section view along one of the CNTs 120. The single layer of the CNTs 120 form the CNT array having the CNTs 120 extend in direction y and arranged in parallel in direction x over the interlayer dielectric layer 115. In one or more embodiments of the present disclosure, the single layer of the CNTs 120 may have a thickness of between about 1 nm and about 1.5 nm.

In one or more embodiments of the present disclosure, once the CNTs 120 are formed, the band-edge shift inducing layers 1451 and 1452 are formed over the first source/drain regions 1201 and the second source/drain regions 1202, respectively, by depositing process, e.g., atomic layer depositing (ALD) process. In some embodiments that the band-edge shift inducing layers 1451 and 1452 serve for inducing a p-type doped behavior in the source/drain regions 1201/1202, the band-edge shift inducing layers 1451 and 1452 may be formed of a metal oxide with a work function greater than 5 eV. For example, the p-type band-edge shift inducing layers 1451 and 1452 includes metal oxide such as $MoO_x$, $WO_x$, $VO_x$, $ReO_x$, $RuO_x$, other suitable metal oxides, or combinations thereof. Thickness of the p-type band-edge shift inducing layers 1451 or 1452 is in a range from about 0 Å to tens Å. In some embodiments that the band-edge shift inducing layers 1451 and 1452 serve for inducing an n-type doped behavior in the source/drain regions 1201/1202, the band-edge shift inducing layers 1451 and 1452 may be formed of a metal oxide with a work function less than 5 eV. For example, the n-type band-edge shift inducing layers 1451 and 1452 includes metal oxide such as $MnO_x$, $SnO_x$, $CoO_x$, $CuO_x$, other suitable metal oxides, or combinations thereof. Thickness of the n-type band-edge shift inducing layers 1451 or 1452 is in a range from about 0 Å to tens Å.

As illustrated in FIGS. 1A, 1B and 1C, in one or more embodiments the contact layers 1501 and 1502 may be formed on and in contact with the opposite first source/drain regions 1201 and second source/drain regions 1202 of the CNTs 120. The contact layers 1501 and 1502 serve as source/drain contacts of the device 100. In some embodiments, the contact layers 1501 and 1502 can include contact metal, such as Pd, Pt, Au, Sc, Y, W, Ti, TiN, other suitable metals, or combinations thereof.

In one or more embodiments of the present disclosure, the gate structure 155 is formed between the first source/drain regions 1201 and the second source/drain regions 1202 and includes two layers of the gate dielectric layers 156 and 157. In one or more embodiments of the present disclosure, the gate structure 155 can include one or more gate dielectric layers.

For example, in some embodiments, the gate dielectric layers 156 and 157 include a high-k dielectric material, such as a metal oxide or a silicate of hafnium, aluminum, zirconium, lanthanum, manganese, barium, titanium, lead, and combinations thereof. The gate dielectric layers 156 and 157 may include a dielectric layer having a k value greater than about 7.0. In one or more embodiments of the present disclosure, the gate dielectric layers 156 and 157 can includes kinds of oxide or nitride such as $SiO_x$, $HfO_x$, $AlO_x$, $YO_x$, $ScO_x$, $MoO_x$, $WO_x$, $VO_x$, $SiN_x$, $AlN_x$, $ScN_x$, etc.

Figure 2A:
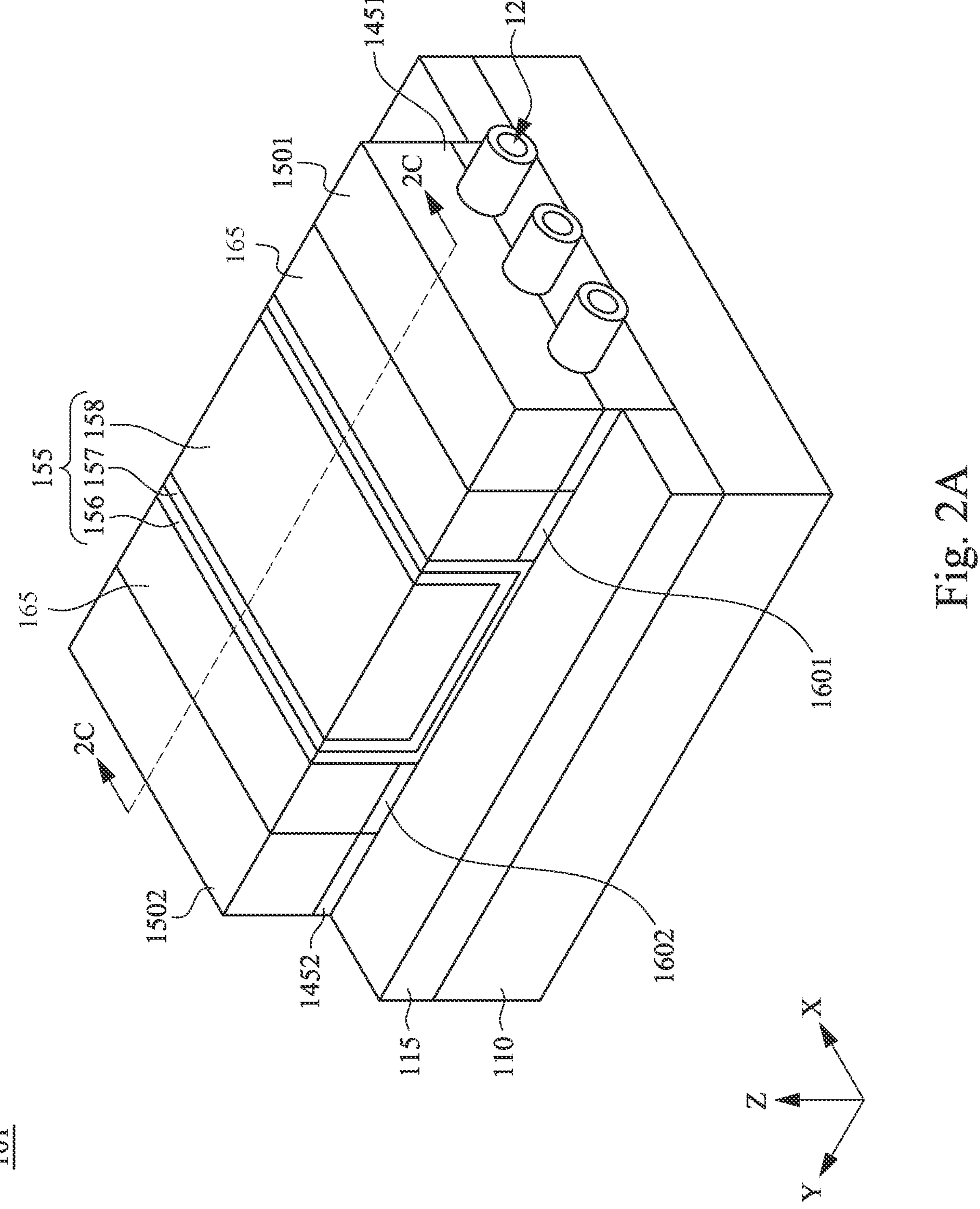
FIGS. 2A, 2B and 2C illustrate a perspective view, a side view and a cross-section view of a device in accordance with some embodiments.
Figure 2C:
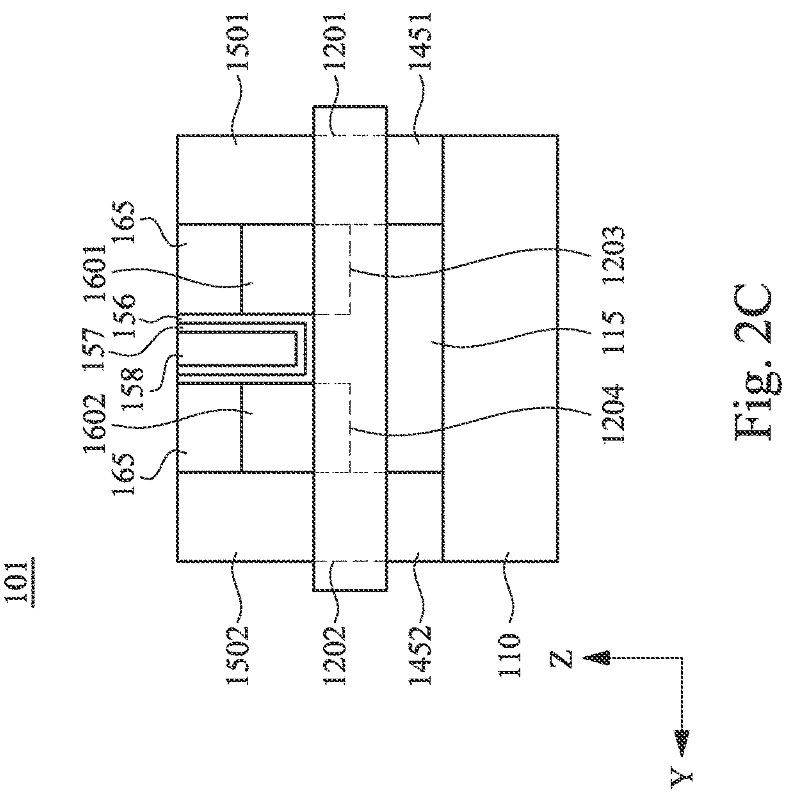
Figure 2B:
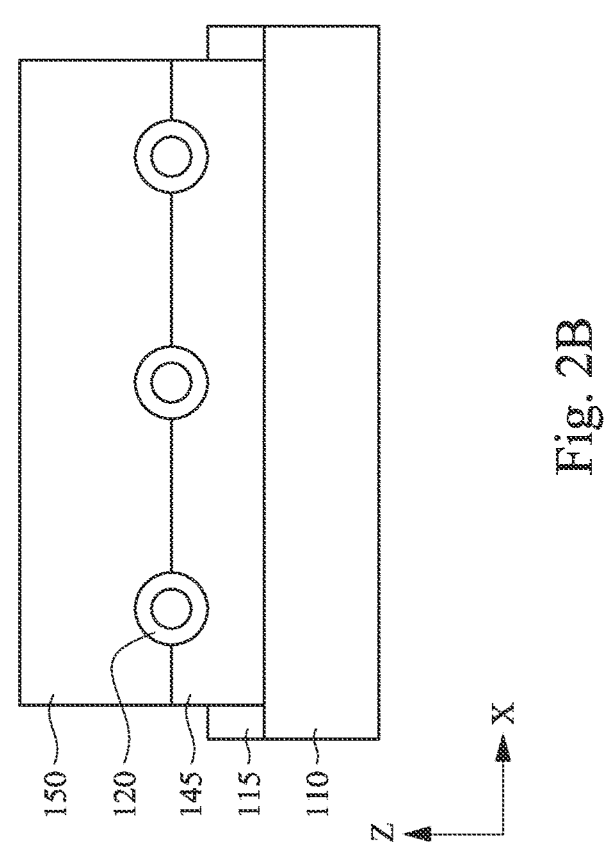

Reference is made to FIGS. 2A, 2B and 2C. FIGS. 2A, 2B and 2C illustrate a perspective view, a side view and a cross-section view of a device 101 in accordance with some embodiments. Differences between the device 101 and the device 100 as illustrated in FIGS. 1A, 1B and 1C include that in the embodiment as illustrated in FIGS. FIGS. 2A, 2B and 2C, the band-edge shift inducing layers 1451 and 1452 have top surfaces lower than tops of the CNTs 120 and upper side surfaces of the first source/drain regions 1201 and the second source/drain regions 1202 of the CNTs 120 are in directly contact with the contact layers 1501 and 1502, respectively. The direct connection between the source/drain regions 1201, 1202 and the contact layers 1501 and 1502 causes great drain current for the device 101.

Figure 3A:
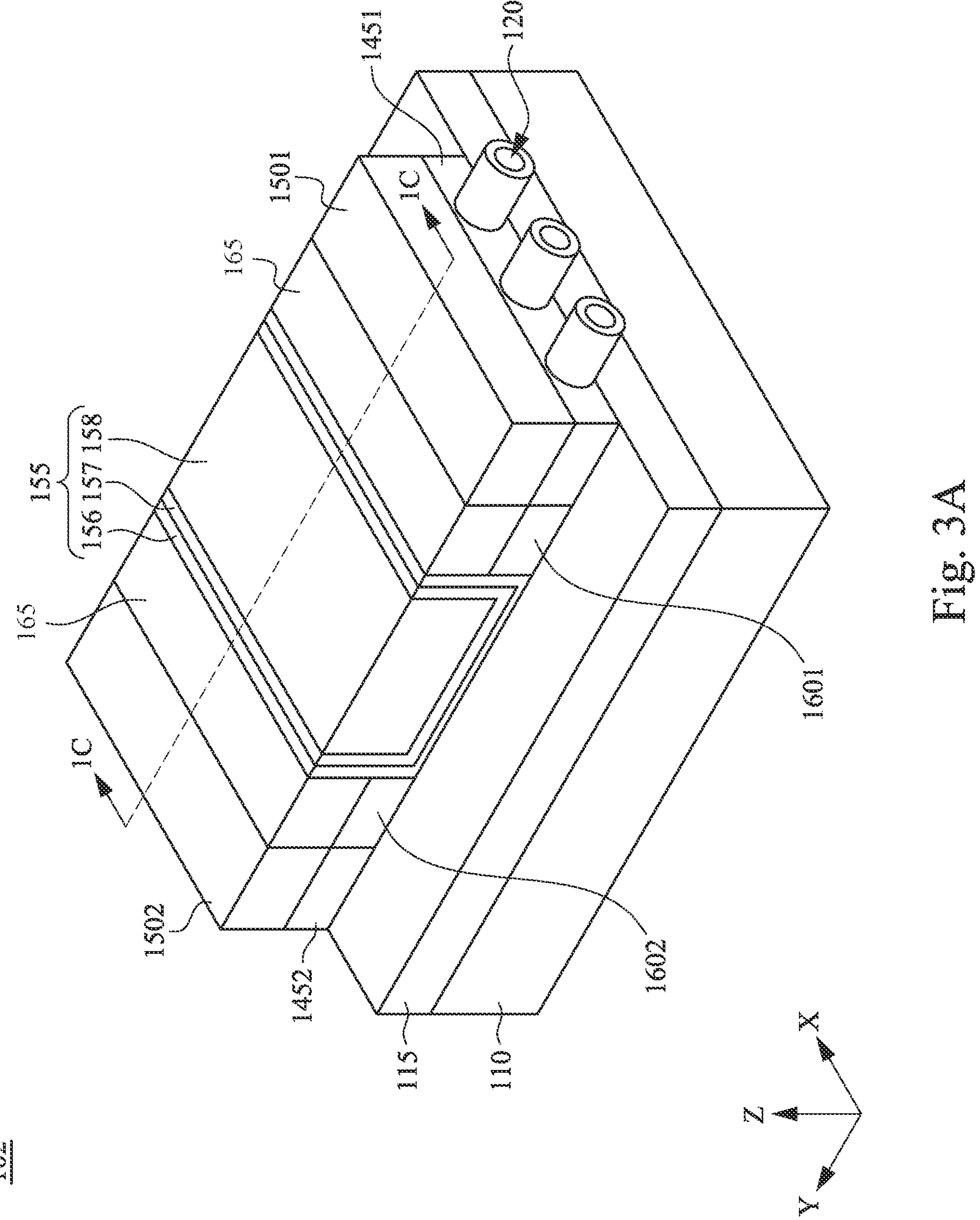
FIGS. 3A, 3B and 3C illustrate a perspective view, a side view and a cross-section view of a device in accordance with some embodiments.
Figure 3C:
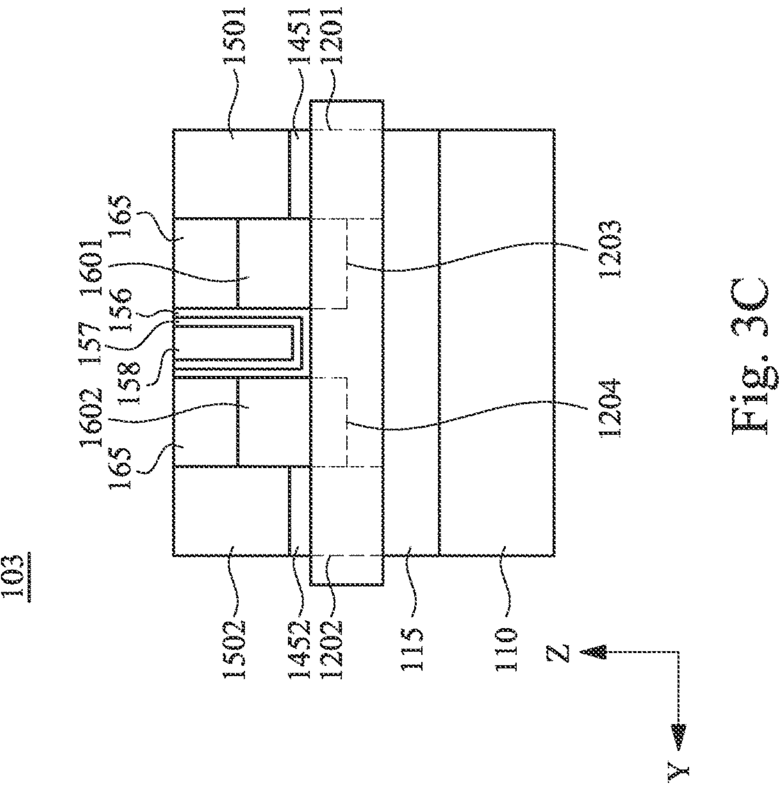
Figure 3B:
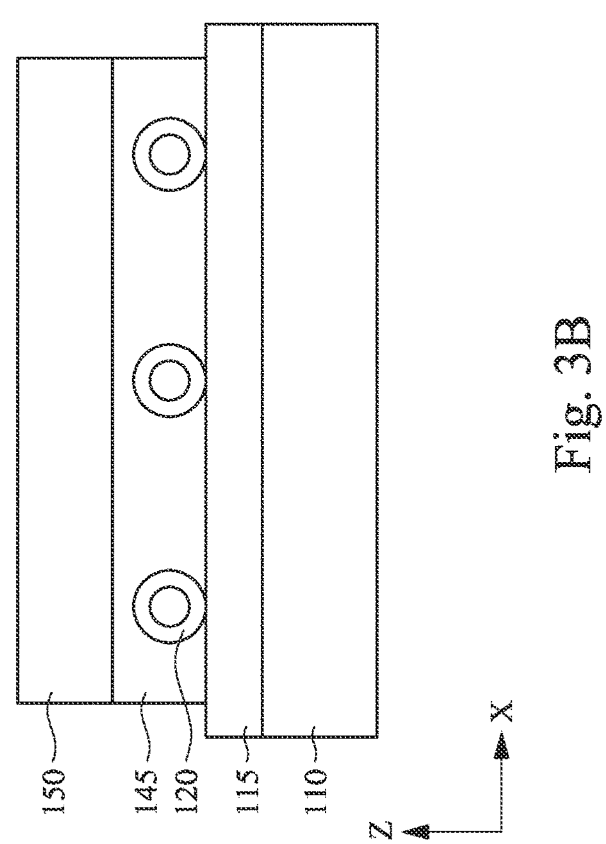

Reference is made to FIGS. 3A, 3B and 3C. FIGS. 3A, 3B and 3C illustrate a perspective view, a side view and a cross-section view of a device 102 in accordance with some embodiments. Differences between the device 102 and the device 100 as illustrated in FIGS. 1A, 1B and 1C include that in the embodiment as illustrated in FIGS. 3A, 3B and 3C, bottom surfaces of the band-edge shift inducing layers 1451 and 1452 are level with the top surface of the interlayer dielectric layer 115 and bottoms of the CNTs 120 are directly contact with the interlayer dielectric layer 115.

Figure 4B:
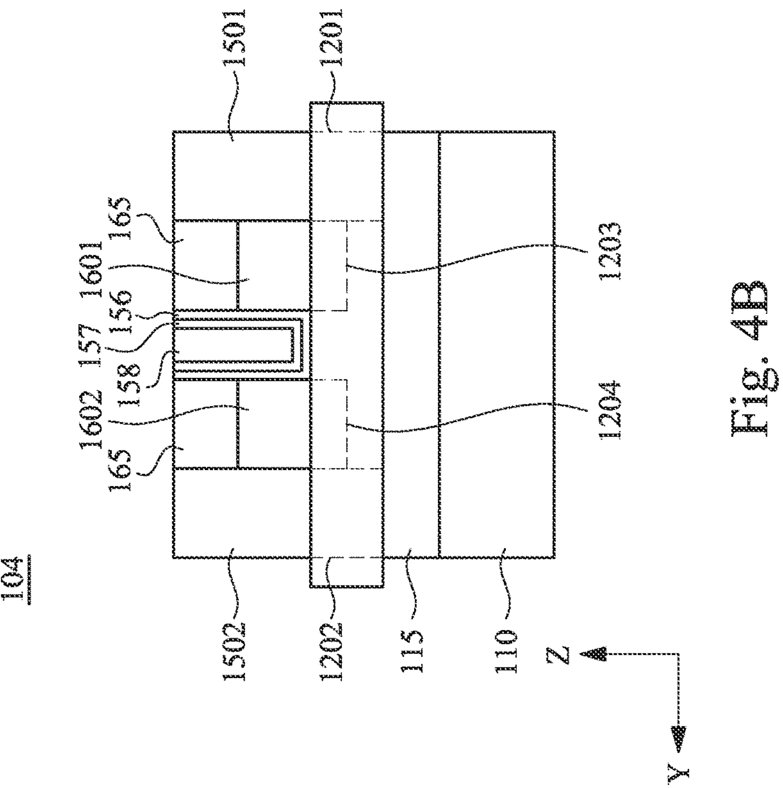
FIGS. 4A and 4B illustrate a side view and a cross-section view of a device in accordance with some embodiments.
Figure 4A:
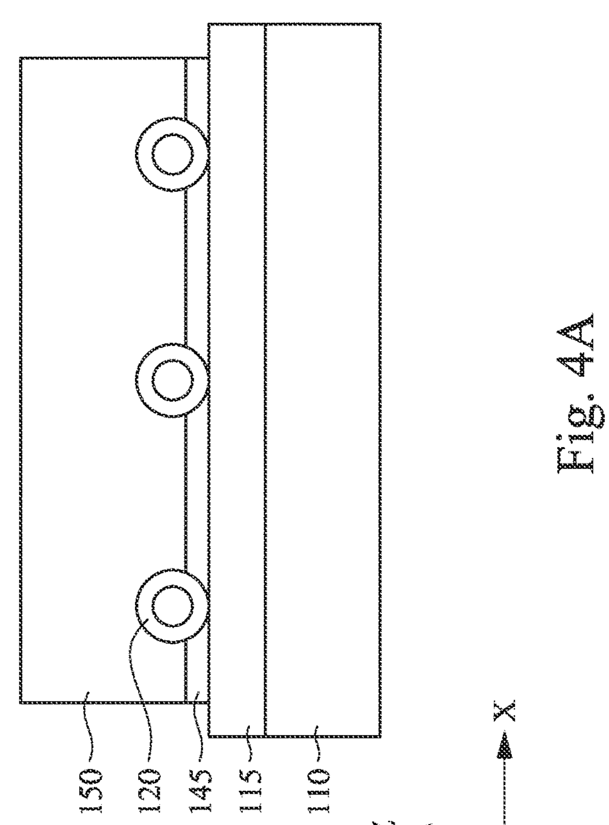

Reference is made to FIGS. 4A and 4B. FIGS. 4A and 4B illustrate a side view and a cross-section view of a device 103 in accordance with some embodiments. Differences between the device 103 the device 100 as illustrated in FIGS. 1A, 1B and 1C include that in the embodiment as illustrated in FIGS. 4A and 4B, the bottom surfaces of the band-edge shift inducing layers 1451 and 1452 are level with the top surface of the interlayer dielectric layer 115 and the band-edge shift inducing layers have top surfaces lower than top of the CNTs 120. As shown in FIGS. 4A and 4B, tops and upper side surfaces of the CNTs 120 are in directly contact with the contact layers 1501 and 1502, and bottoms of the CNTs 120 are in contact with the interlayer dielectric layer 115.

Figure 5B:
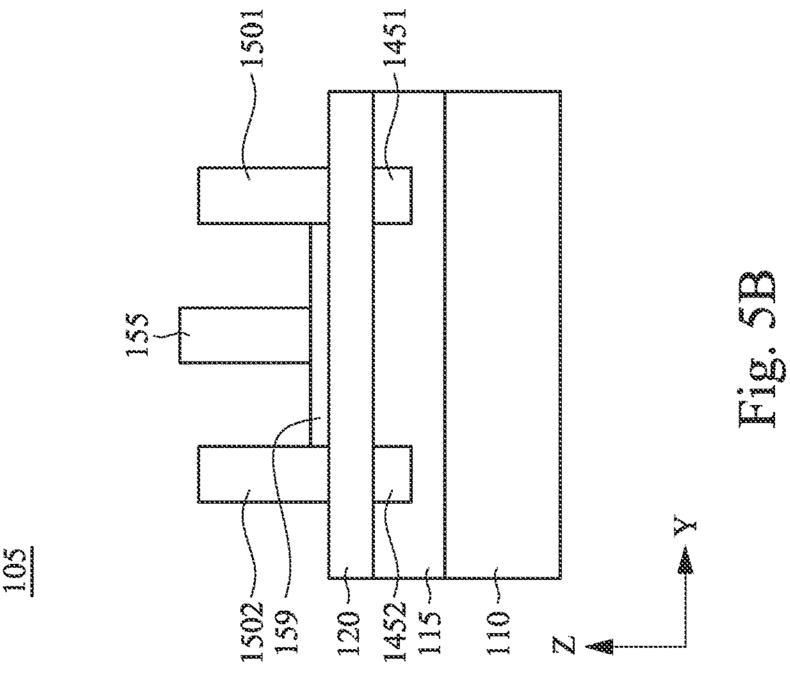
FIGS. 5A and 5B illustrate a side view and a cross-section view of a device in accordance with some embodiments.
Figure 5A:
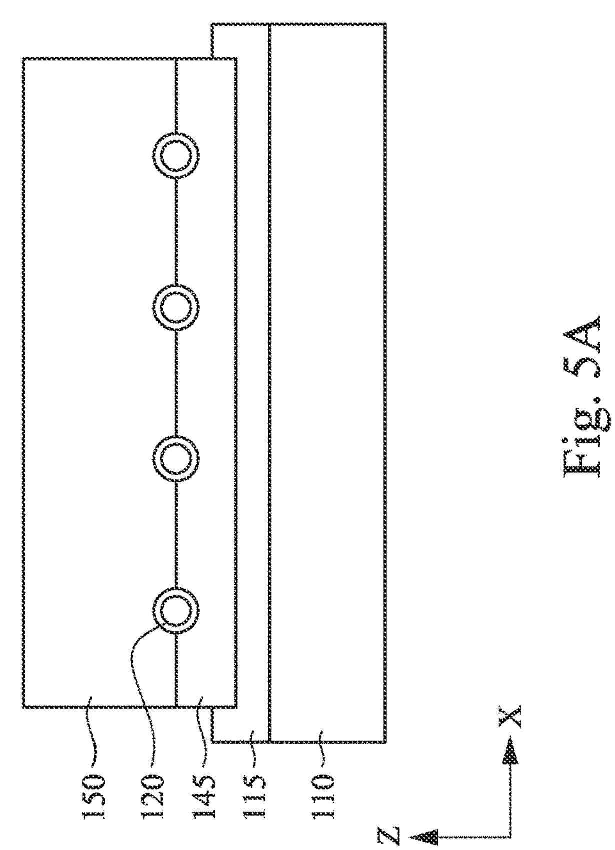

Reference is made to FIGS. 5A and 5B. FIGS. 5A and 5B illustrate a side view and a cross-section view of a device 104 in accordance with some embodiments. Differences between the device 104 and the device 100 as illustrated in FIGS. 1A, 1B and 1C include that in the embodiment as illustrated in FIGS. 5A and 5B, top surfaces of the band-edge shift inducing layer 1451 and 1452 are lower than top of the CNTs 120 and bottom surfaces of the band-edge shift inducing layers 1451 and 1452 extend with the interlayer dielectric layer 115 and not to a top surface of the substrate 110. In the embodiment as illustrated in FIGS. 5A and 5B, the upper side surfaces of the CNTs 120 are in directly contact with the contact layers 1501 and 1502.

Figure 6B:
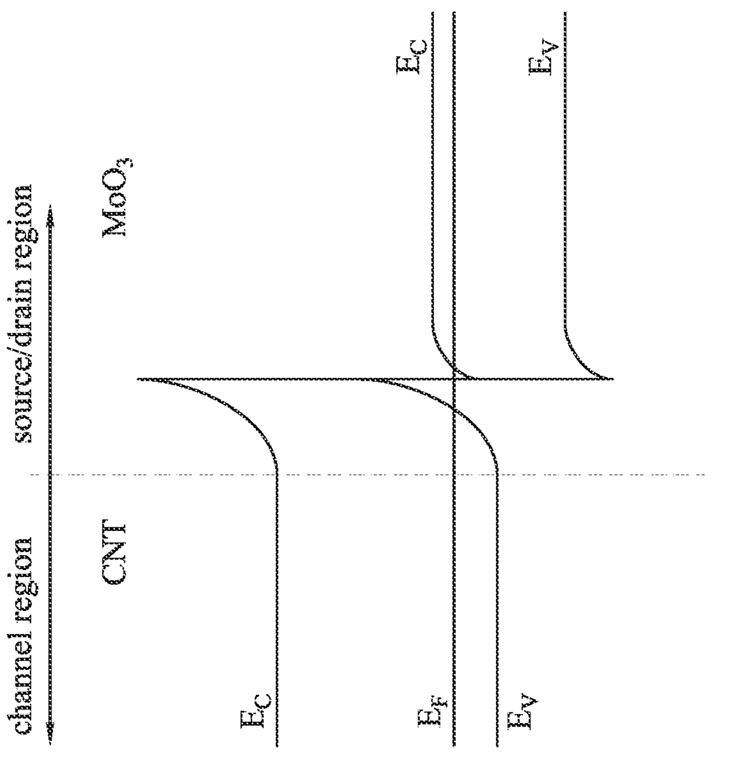
FIGS. 6A and 6B illustrate band diagram of a junction of a carbon nanotube and a band-edge shift inducing layer in accordance with some embodiments.
Figure 6A:
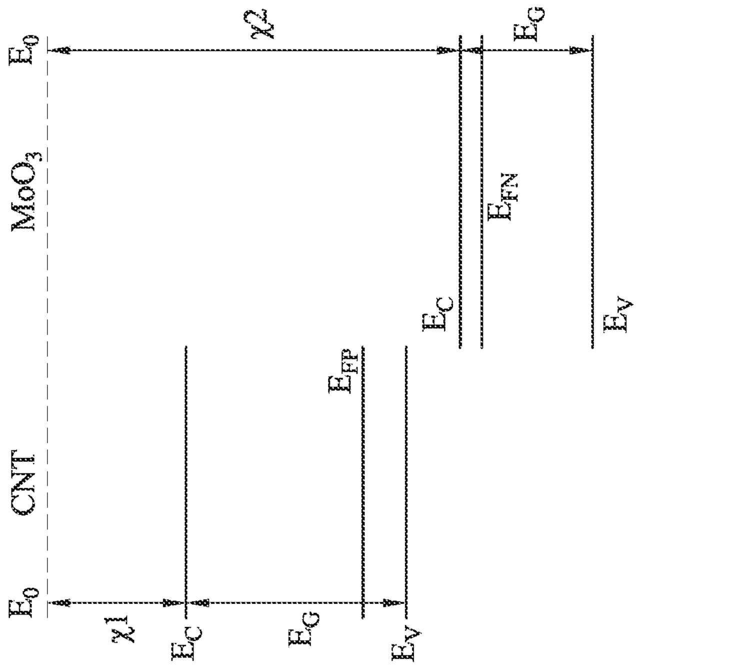
Figure 6C:
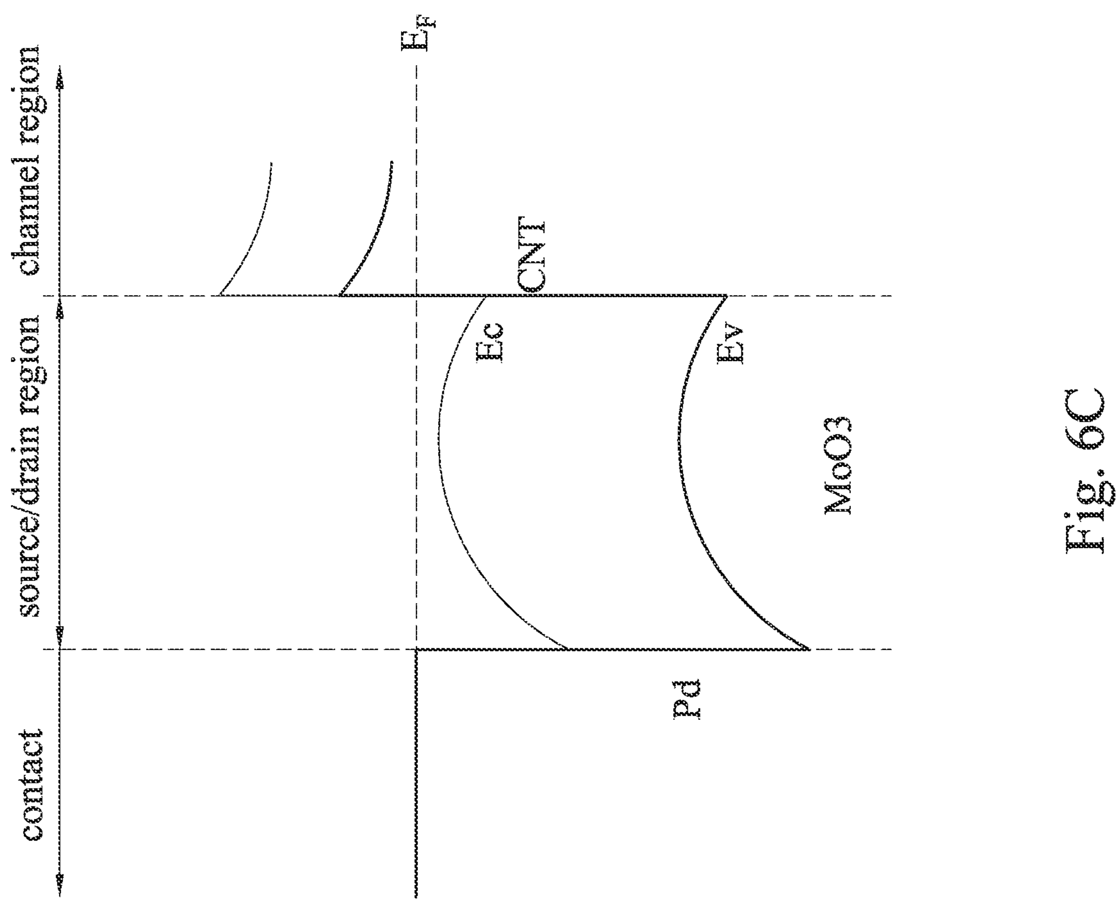
FIG. 6C illustrates a band diagram of a junction of a carbon nanotube and a band-edge shift inducing layer in accordance with some embodiments.

Reference is made to FIGS. 6A, 6B and 6C to illustrate mechanism of the CNT/band-edge shift inducing layer junction of the device in one or more embodiment of the present disclosure.

FIGS. 6A and 6B illustrate band diagram of a junction of a carbon nanotube and a band-edge shift inducing layer in accordance with some embodiments. In the embodiment as illustrated in FIGS. 6A and 6B, material of the band-edge shift inducing layer is $MoO_3$.

FIG. 6A illustrates a band diagram prior to the CNT and the $MoO_3$ band-edge shift inducing layer in contact with each other. Vertical axis of FIG. 6A presents energy levels with respect to ground energy $E_0$. As shown in FIG. 6A, the CNT and the $MoO_3$ band-edge shift inducing layer are semiconductor, so that the Fermi level $E_{FP}$ of the CNT or the Fermi level $E_{FN}$ the $MoO_3$ band-edge shift inducing layer is located between the conduction band $E_C$ and the valence band $E_V$. Since the CNT and the $MoO_3$ band-edge shift inducing layer are different materials, the CNT and the $MoO_3$ band-edge shift inducing layer have different work functions, and the Fermi level $E_{FP}$ of the CNT and the Fermi level $E_{FN}$ of the $MoO_3$ band-edge shift inducing layer are located at different energy levels with respect to the ground energy $E_0$.

FIG. 6B illustrates a band diagram after the source/drain region of CNT is interfaced with the $MoO_3$ band-edge shift inducing layer. Vertical axis of FIG. 6B presents energy levels with respect to the ground energy $E_0$. After the CNT/$MoO_3$ band-edge shift inducing layer junction is formed at source/drain regions of the CNT, the Fermi level $E_{FP}$ of the CNT and the Fermi level $E_{FN}$ the $MoO_3$ band-edge shift inducing layer are aligned with a shifted Fermi level $E_F$, and it causes band-edge shifting for both the conduction band and valence band of the CNT and the $MoO_3$ band-edge shift inducing layer. At the interface of the CNT and the $MoO_3$ band-edge shift inducing layer, band edges of the conduction band $E_C$ and the valence band $E_V$ of the CNT are shifted upwards, and band edges of the conduction band $E_C$ and the valence band $E_V$ of the $MoO_3$ band-edge shift inducing layer are shifted downwards, so that the Fermi level $E_{FP}$ of the CNT and the Fermi level $E_{FN}$ the $MoO_3$ band-edge shift inducing layer are able to be aligned with each other at the Fermi level $E_F$. As shown in FIG. 6B, a portion of the band edge of the valence band $E_V$ of the CNT is shifted upwards and higher than the Fermi level $E_F$, and holes in the valence band $E_V$ higher than the Fermi level $E_F$ can be used as dominant carriers for source/drain regions of the CNT. That is, the $MoO_3$ band-edge shift inducing layer can induce a heavily p-doped behavior in source/drain regions of the CNT. Carriers are provided and can be transferred through the junction of the CNT and the $MoO_3$ band-edge shift inducing layer. As illustrated in FIG. 6B, valence band edges in the source/drain regions of the CNT are shifted from a valence band edge in the channel region of the CNT. This is because the valence band edges in the source/drain regions are in contact with the $MoO_3$ band-edge shift inducing layers, while the channel region is spaced apart from the $MoO_3$ band-edge shift inducing layers.

FIG. 6C illustrates a band diagram of a junction of a carbon nanotube and a band-edge shift inducing layer in accordance with some embodiments. FIG. 6C further illustrates a band diagram that a Pd metal contact layer, a $MoO_3$ band-edge shift inducing layer and a CNT connected in order. The Pd metal contact layer is conductive metal material. The $MoO_3$ band-edge shift inducing layer and the CNT are semiconductors. Similar to FIG. 6B, in FIG. 6C, a band edge of the valence band $E_V$ of the CNT is shifted upwards and provides free carriers in the valence band $E_V$ higher than the Fermi level $E_F$. In addition, the conduction band $E_C$ of the $MoO_3$ band-edge shift inducing layer is lower than the Fermi level $E_F$, causing a free electron path. Accordingly, the CNT is doped by the $MoO_3$ band-edge shift inducing layer and has free carriers being able to transfer.

Figure 18:
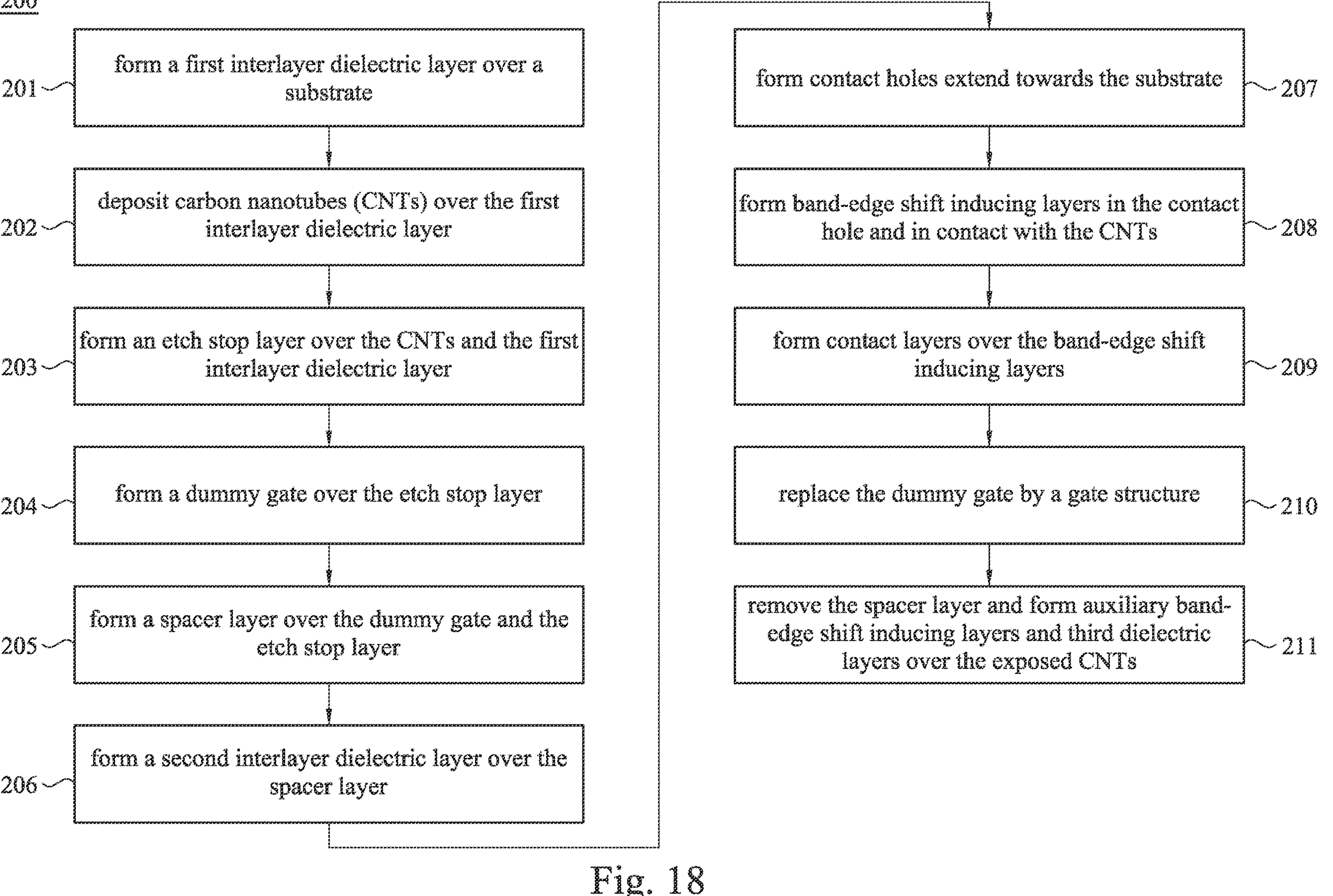
FIG. 18 illustrates a flow chart of a method of forming a device in accordance with some embodiments.

Reference is made to FIGS. 7A-18 to illustrate forming a device according to one or more embodiment of the present disclosure. FIGS. 7A-17D illustrate a plurality of top views and cross-section views in different operations of a method of forming a device according to one or more embodiment of the present disclosure. FIG. 18 illustrates a flow chart of a method 200 of forming a device in accordance with some embodiments. In one or more embodiments as illustrated in FIG. 18 of the present disclosure, the method 200 includes operations 201-211.

Figure 7B:
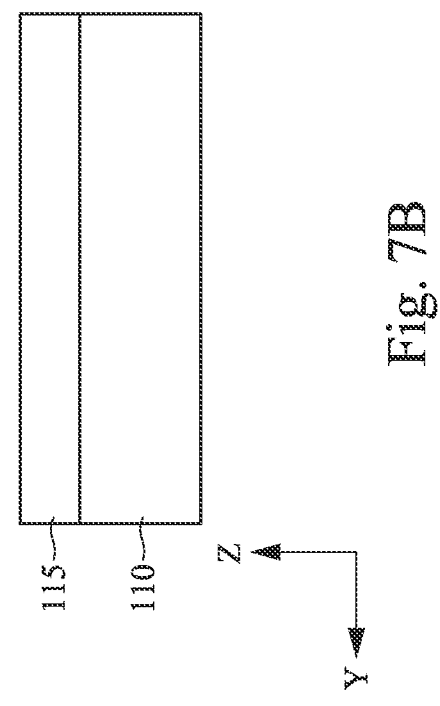
FIGS. 7A-7C illustrate forming a first interlayer dielectric layer over a substrate in accordance with some embodiments.
Figure 7A:
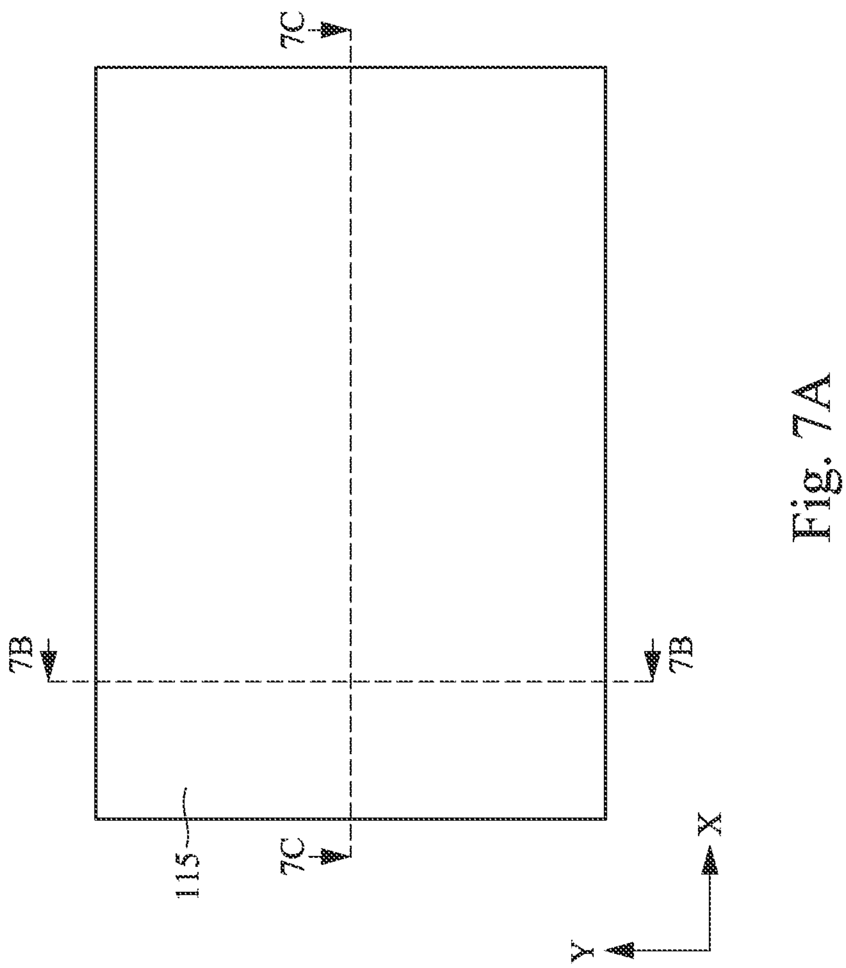
Figure 7C:
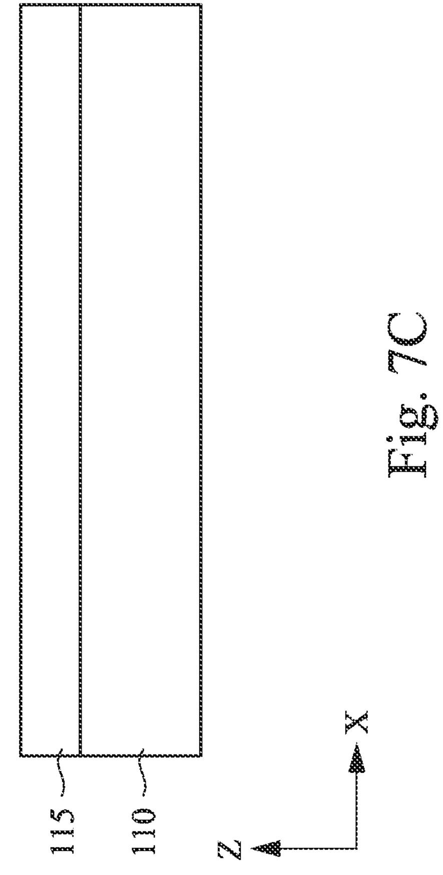

Reference is made to FIGS. 7A-7C and 18. In operation 201, form a first interlayer dielectric layer 115 over a substrate 110. FIGS. 7A-7C illustrate forming a first interlayer dielectric layer 115 over a substrate 110 in accordance with some embodiments, wherein FIG. 7A illustrates a top view and FIGS. 7B and 7C illustrates cross-section views of FIG. 7A.

In one or more embodiments the substrate 110 may be a support material such as a silicon material (e.g., a silicon wafer), a germanium material, a silicon germanium material, a gallium arsenide material, although other substrates, such as semiconductor-on-insulator (SOI), strained SOI, silicon germanium on insulator, glass substrate, combinations of these, or the like. However, any suitable material may be used for the substrate 110.

The first interlayer dielectric layer 115 is located over the substrate 110 and is utilized to isolate devices subsequently formed on the substrate 110. In one or more embodiments the first interlayer dielectric layer 115 is a dielectric material such as silicon oxide, aluminum oxide, combinations of these, or the like deposited onto the substrate 110 using a deposition process such as chemical vapor deposition, sputtering, atomic layer deposition, combinations of these, or the like. In one or more embodiments of the present disclosure, the interlayer dielectric layer 115 can be kinds of oxide or nitride such as $SiO_2$, $HfO_2$, $Al_2O_3$, SiN, $\alpha$-BN, etc. However, any suitable material and any suitable deposition process may be utilized.

Additionally, while FIGS. 7A-7C illustrate the first interlayer dielectric layer 115 as being directly on and in physical contact with the substrate 110, this is intended to be illustrative and is not intended to be limiting. Rather, other dielectric materials and other substrate materials (e.g., silicon, germanium, gallium arsenide, combinations of these, or the like) may also be present between the first interlayer dielectric layer 115 and the substrate 110. All such combinations of layers may be used, and all are fully intended to be included within the scope of the embodiments.

Figure 8B:
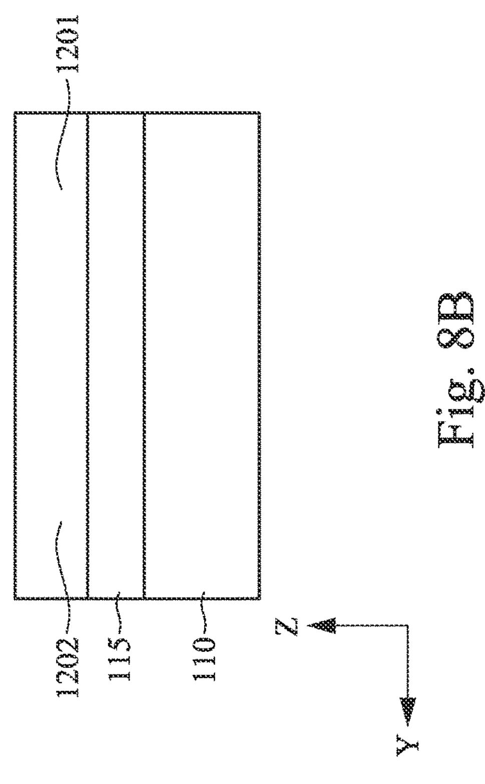
FIGS. 8A-8C illustrate depositing an array of carbon nanotubes in accordance with some embodiments.
Figure 8A:
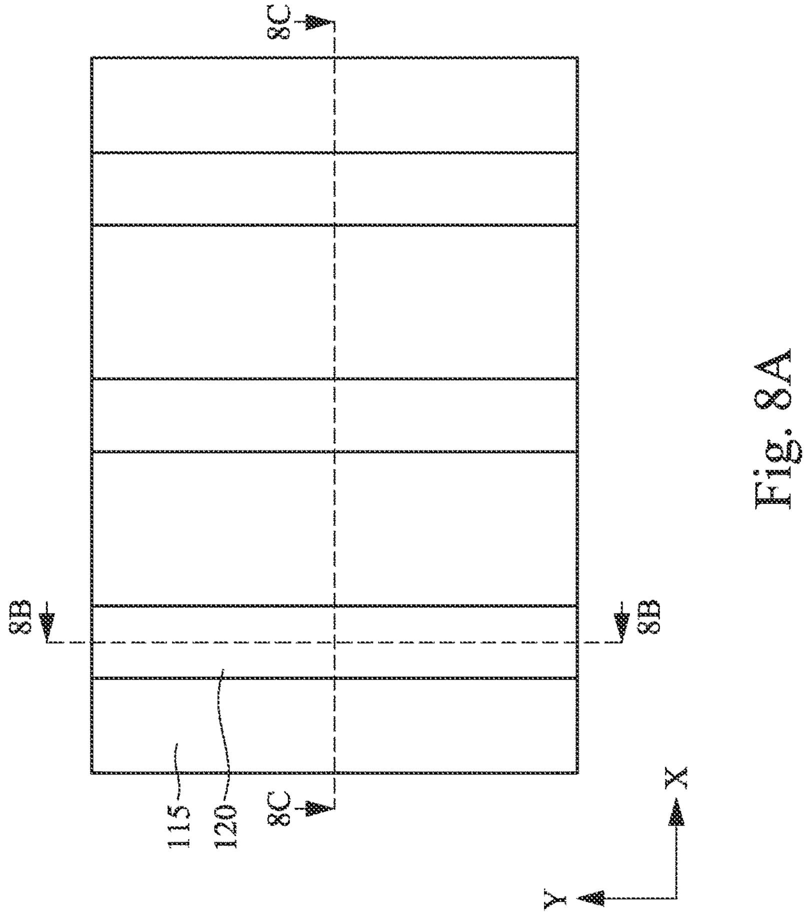
Figure 8C:
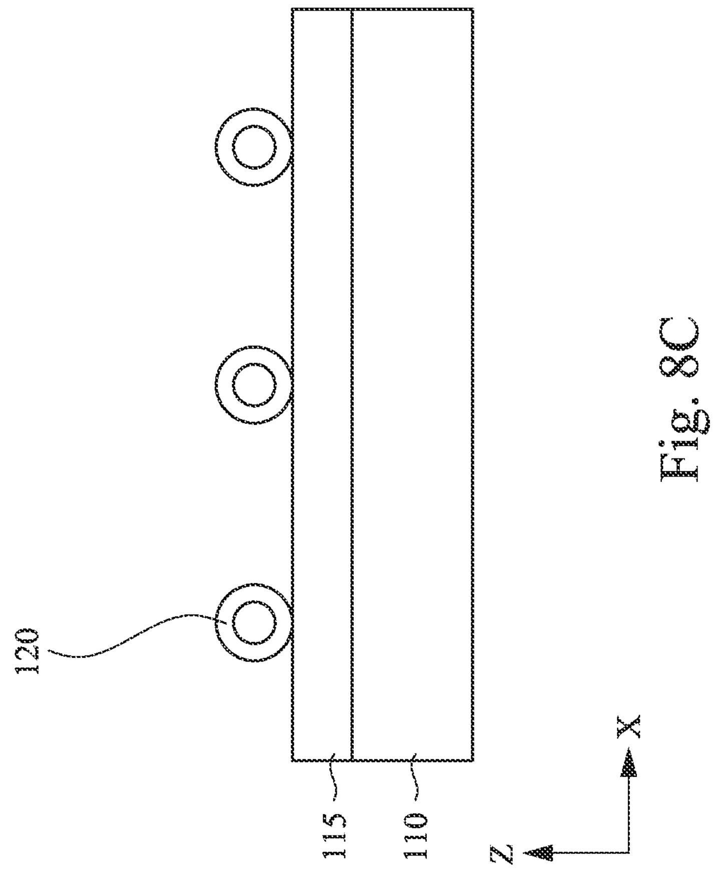

Reference is made to FIGS. 8A-8C and 18. In operation 202, a plurality of carbon nanotubes (CNTs) 120 is deposited over the first interlayer dielectric layer 115 on the substrate 110. FIGS. 8A-8C illustrate depositing an array of carbon nanotubes 120 in accordance with some embodiments, wherein FIG. 8A illustrates a top view and FIGS. 8B and 8C illustrates cross-section views of FIG. 8A. As shown in FIGS. 8A, 8B and 8C, the deposited CNTs 120 extend in direction y and arrange in direction in parallel. Bottoms of the CNTs 120 are in directly contact with the first interlayer dielectric layer 115.

In one or more embodiments of the present disclosure, the CNTs 120 are single-walled carbon nanotubes, wherein each single-walled carbon nanotube is formed by a single layer of carbon. The function of the CNTs 120 is the one dimensional semiconducting material for beyond silicon logic transistor. In some embodiments, a thickness of one of the CNTs 120 is in a range from about 0 Å to tens Å. A height of a bottom side of each CNT 120 is aligned with a top surface of the interlayer dielectric layer 115.

In one or more embodiments the CNTs 120 may be single-walled carbon nanotubes formed using any suitable method, such as a carbon arc discharge method (with subsequent purification), a laser vaporization method, a catalyzed chemical vapor deposition, ball milling and subsequent annealing, diffusion flame syntheses, electrolysis, heat treatment of a polymer, low-temperature solid pyrolysis, combinations of these, or the like. However, any suitable method of manufacturing the CNTs 120 may be utilized, and all such methods are fully intended to be included within the scope of the embodiments.

In one or more embodiments of the present disclosure, a plurality of the CNTs 120 forms a stack of the CNTs 120 deposited over a filter member (not illustrated) in a system used for manufacturing the CNTs 120, and then the stack of the CNTs 120 is transferred from the filter member to the first interlayer dielectric layer 115 by a transfer layer (not illustrated). The stack of the CNTs 120 over the first interlayer dielectric layer 115 is then thinned such that a single layer of the CNTs 120 remains on the first interlayer dielectric layer 115, wherein the single layer of the CNTs 120 can be the array of the CNTs 120 deposited over the first interlayer dielectric layer 115. In one or more embodiments of the present disclosure, a supporting layer used for reducing one or more layers of the CNTs 120 can be additionally deposited over the stack of the CNTs 120 so as to remove one or more layers of the CNTs 120 of the stack of the CNTs 120 at the same time. In some embodiments of the present disclosure, in order to precisely control pitch of the remaining CNTs 120 over the first interlayer dielectric layer 115, additional spacers (not illustrated) can be additionally formed on the CNTs 120 and removed from the CNTs 120 after only a single layer of the CNTs 120 remains on the first interlayer dielectric layer 115.

In one or more embodiments the filter membrane may be a material such as polycarbonate, polytetrafluoroethene, or polyvinylidene fluoride, with a pore diameter that is smaller than the CNTs 120 (in order to filter the CNTs 120), such as being between about 0.01 μm and about 10 μm. However, any suitable material and any suitable pore diameter may be utilized. In one or more embodiments the transfer layer may be polycarbonate (PC), polymethyl-methacrylate (PMMA), although any other suitable material, such as methyacrylic resin or Novolac resin, or the like, may alternatively be utilized. In one or more embodiments in which the transfer layer is PMMA, the transfer layer may be placed on the stack of the CNTs 120 using, e.g., a spin-coating process, although any other suitable deposition process may also be utilized. Once in place, the PMMA may be cured and solidified. This solidified PMMA both protects the stack of the CNTs 120 and also allows for the movement and control of the stack of the CNTs 120 through the transfer layer. In other embodiments the supporting layer may be an organic material such as polymethyl methacrylate (PMMA), polyvinyl acetate (PVA), polyvinylpyrrolidone (PVP), polypropylene carbonate (PPC), other polyaromatic hydrocarbons (PAHs), phenyltrimethoxysilane (PTMS), polydimethylsiloxane (PDMS), rosin, combinations of these, or the like. In embodiments such as this, the material of the supporting layer may be deposited using a deposition method such as spin-coating or the like. However, any suitable material and method of deposition may be utilized. In one or more embodiments the addition spacers formed on the CNTs 120 may be a material such as a surfactant (e.g., sodium dodecyl sulfate, sodium dodecylbenzenesulfonate, sodium deoxycholate, etc.), a polymer (e.g., poly[(9,9-dioctylfluorenyl-2,7-diyl)-alt-co-(6,6'-{2,2'-bipyridine}), isoindigo-based poly (9, 9-dioctylfluorene), poly[9-(1-octylonoyl)-9H-carbazole-2,7-diyl, etc.), a dielectric material (e.g., $HfO_2/SiO_2/Al_2O$, etc.) or even other nanotubes (e.g., a boron nitride nanotube, a $MoS_2$ nanotube, etc.). However, any suitable material or combination of materials may be utilized to surround and coat the CNTs 120 to control the pitch of the CNTs 120.

In some embodiments the array of the CNTs 120 over the first interlayer dielectric layer 115 has a thickness in a range from about 0 Å to tens Å in direction z. In some embodiments the CNTs 120 may have a pitch of between about 0 nm and about 100 nm in direction x. However, any suitable thickness or suitable pitch may be utilized.

As shown in FIGS. 8A-8C, each of the CNTs 120 extends in direction y and has a first source/drain region 1201 and a second source/drain region 1202 opposite to the first source/drain region 1201.

Figure 9B:
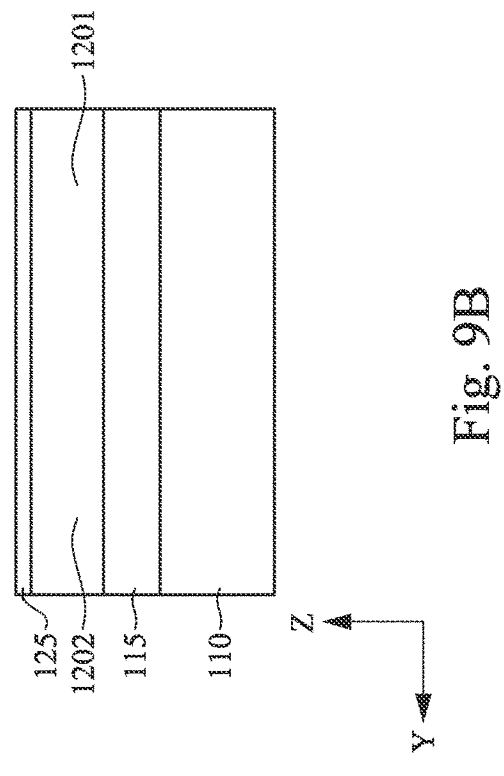
FIGS. 9A-9C illustrate forming an etch stop layer over the carbon nanotubes and the first interlayer dielectric layer in accordance with some embodiments.
Figure 9A:
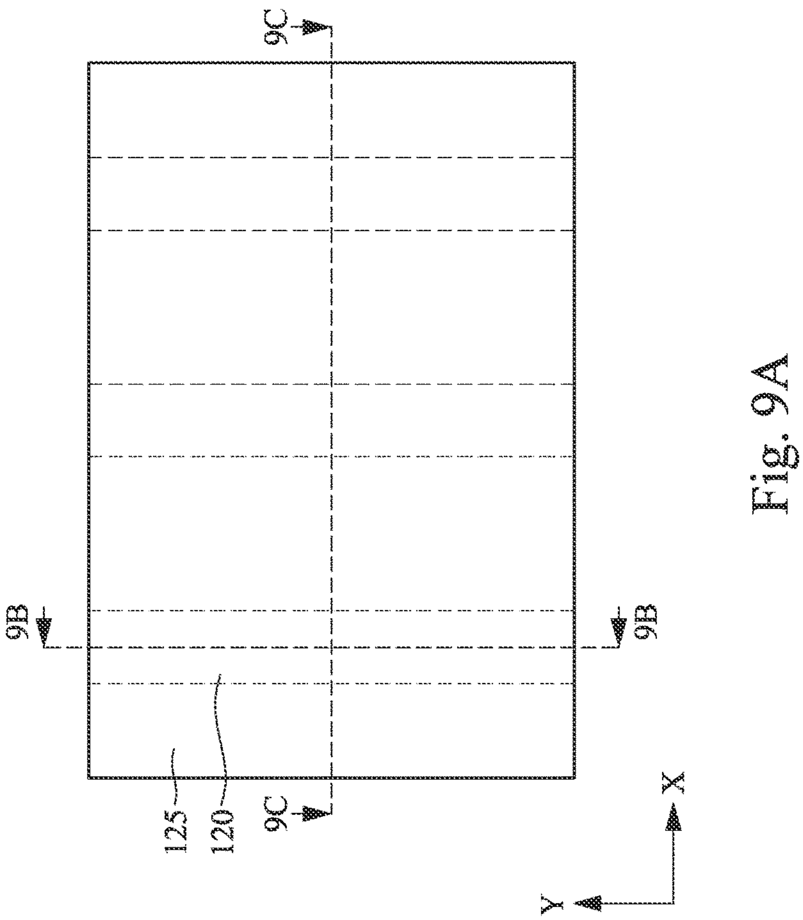
Figure 9C:
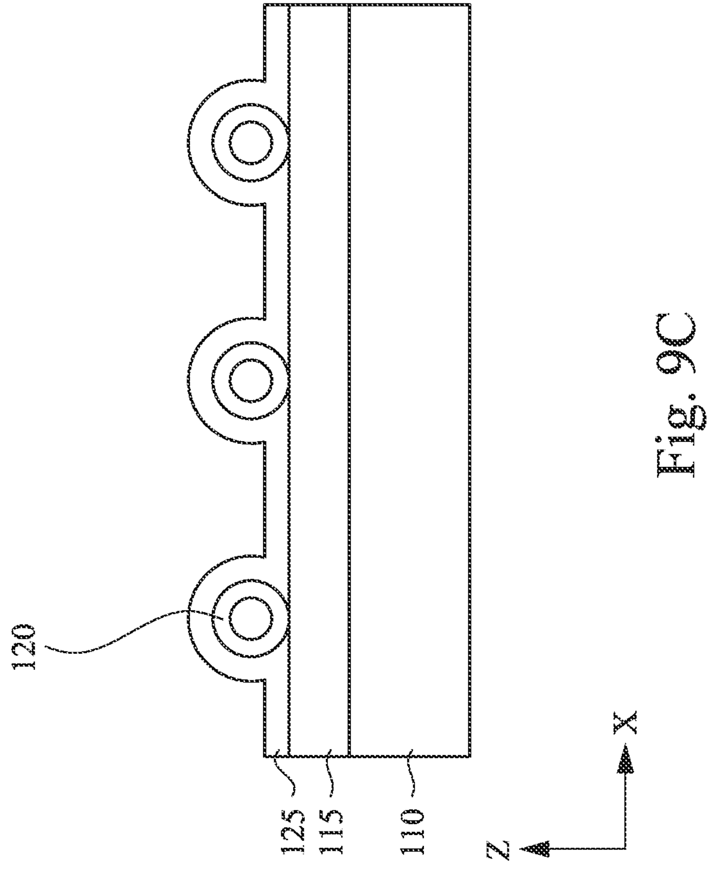

Reference is made to FIGS. 9A-9C and 18. In operation 203, an etch stop layer 125 is conformally formed over the CNTs 120 and the first interlayer dielectric layer 115. FIGS. 9A-9C illustrate forming an etch stop layer 125 over the CNTs 120 and the first interlayer dielectric layer 115 in accordance with some embodiments, wherein FIG. 9A illustrates a top view and FIGS. 9B and 9C illustrates cross-section views of FIG. 9A. The etch stop layer 125 can be named as carbon nanotube etch stop layer (CNTESL). In one or more embodiments of the present disclosure, the etch stop layer 125 can be any kinds of oxide, nitride such as $SiO_x$, $AlO_x$, $HfO_x$, $SiN_x$, $AlN_x$, $HfN_x$, α-BN, c-BN, etc.

Figure 10B:
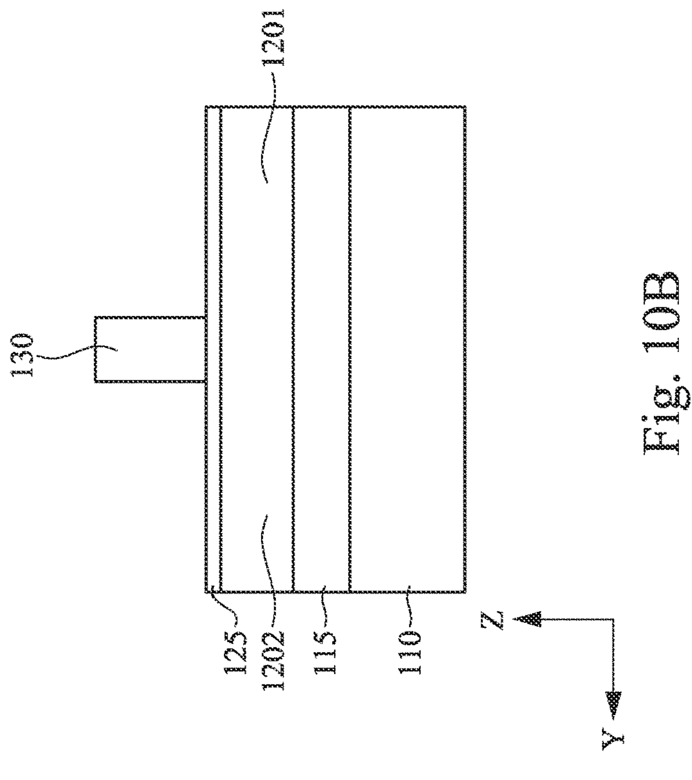
FIGS. 10A-10C illustrate forming a dummy gate over the etch stop layer in accordance with some embodiments.
Figure 10A:
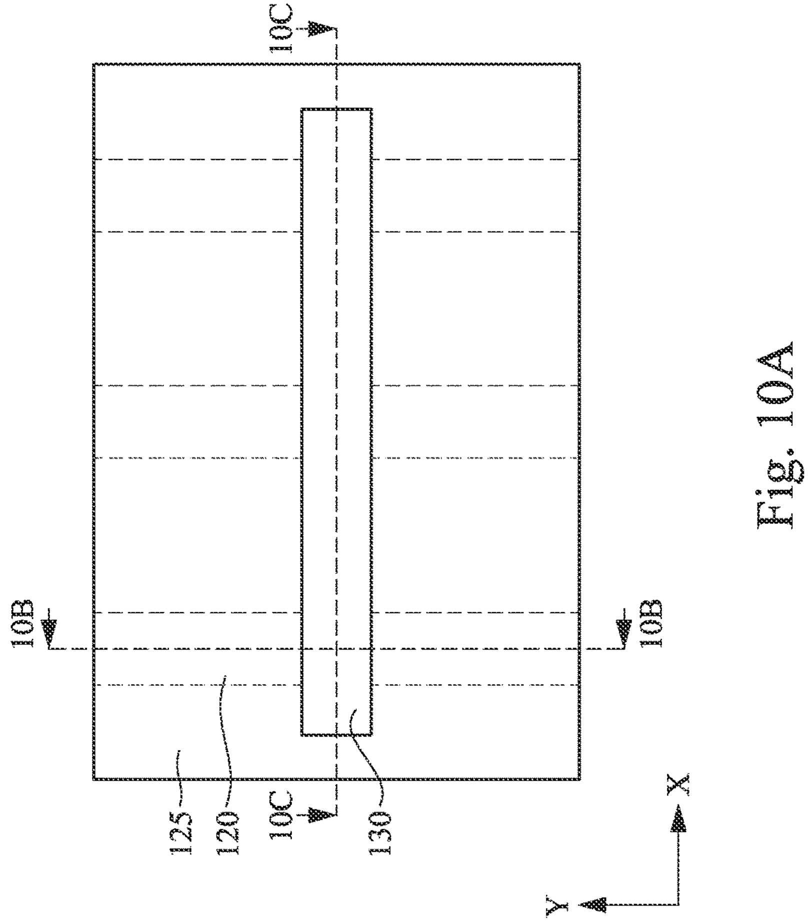
Figure 10C:
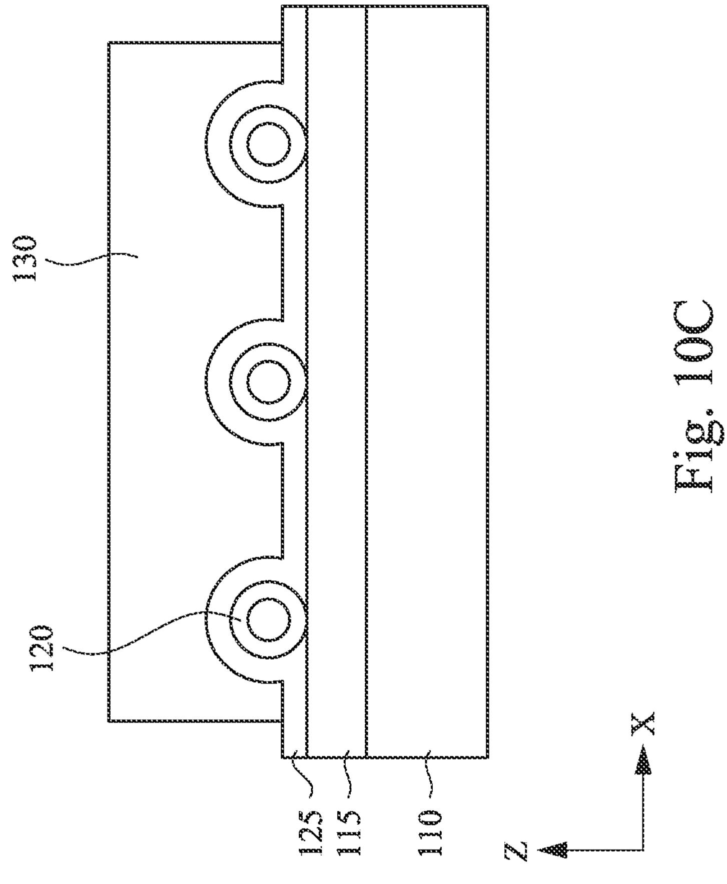

Reference is made to FIGS. 10A-10C and 18. In operation 204, a dummy gate 130 is formed over the etch stop layer 125. FIGS. 10A-10C illustrate forming a dummy gate 130 over the etch stop layer 125 in accordance with some embodiments, wherein FIG. 10A illustrates a top view and FIGS. 10B and 10C illustrates cross-section views of FIG. 10A. The dummy gate 130 is located between the first source/drain regions 1201 and the second source/drain regions 1202 of the CNTs 120. In one or more embodiments of the present disclosure, the dummy gate 130 can be any kinds of metal, oxide or nitride such as Pd, Sc, Y, W, Ti, TiN, poly-Si, $SiO_2$, SiN, etc. In the embodiment as shown in FIGS. 10A-10C of the present disclosure, the dummy gate 130 extends across all of the CNTs 120.

Figure 11B:
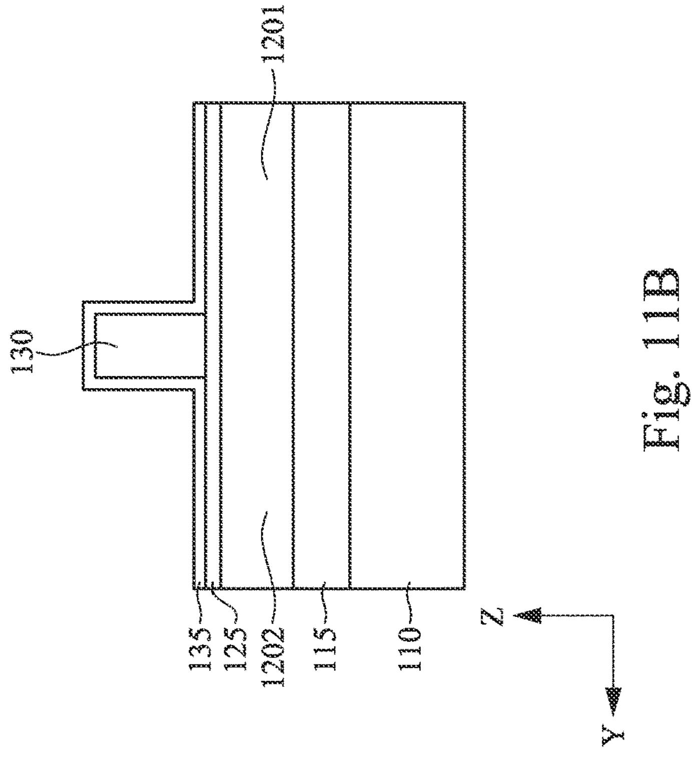
FIGS. 11A-11C illustrate forming a spacer layer over the dummy gate and the etch stop layer in accordance with some embodiments.
Figure 11A:
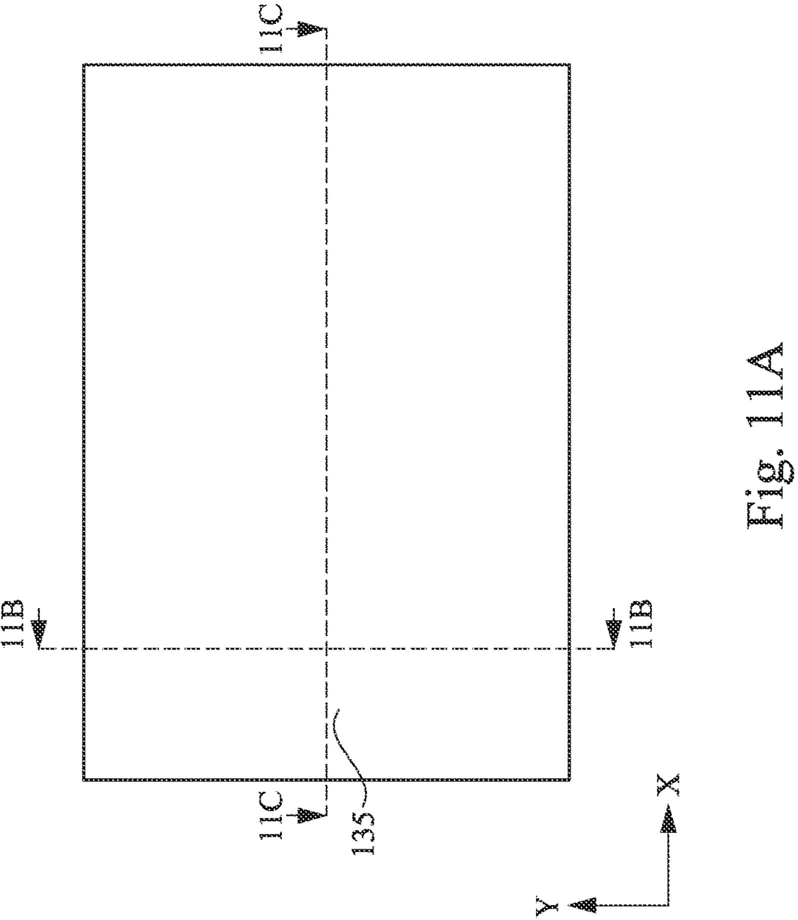
Figure 11C:
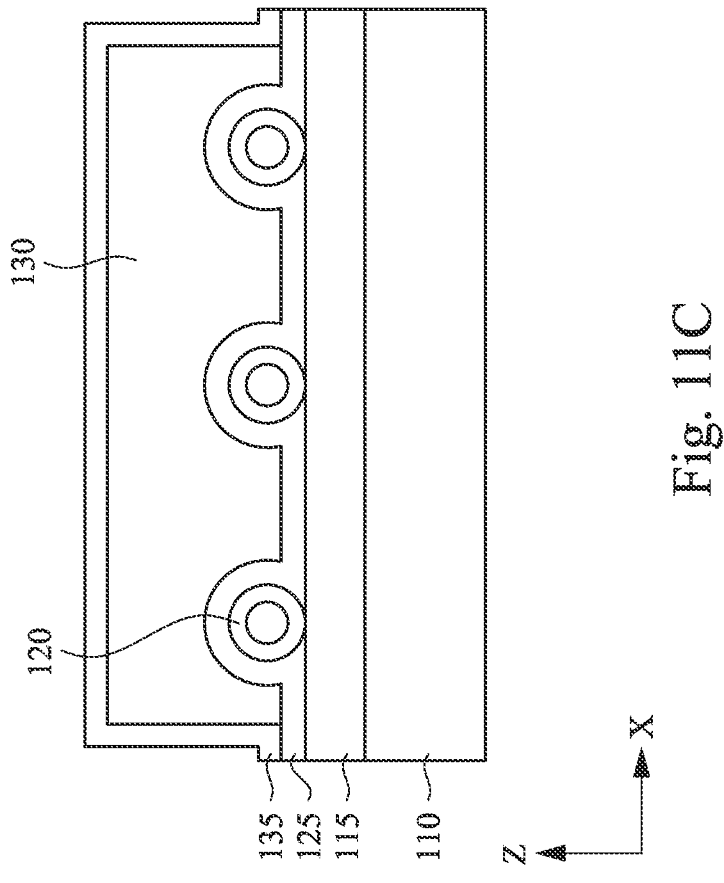

Reference is made to FIGS. 11A-11C and 18. In operation 205, a spacer layer 135 is formed over the dummy gate 130 and the etch stop layer 125. FIGS. 11A-11C illustrate conformally forming a spacer layer 135 over the dummy gate 130 and the etch stop layer 125 in accordance with some embodiments, wherein FIG. 11A illustrates a top view and FIGS. 11B and 11C illustrates cross-section views of FIG. 11A. In one or more embodiments of the present disclosure, the spacer layer 135 can be any kinds of oxide, nitride such as $SiO_2$, $HfO_2$, $Al_2O_3$, SiN, α-BN, etc.

Figure 12B:
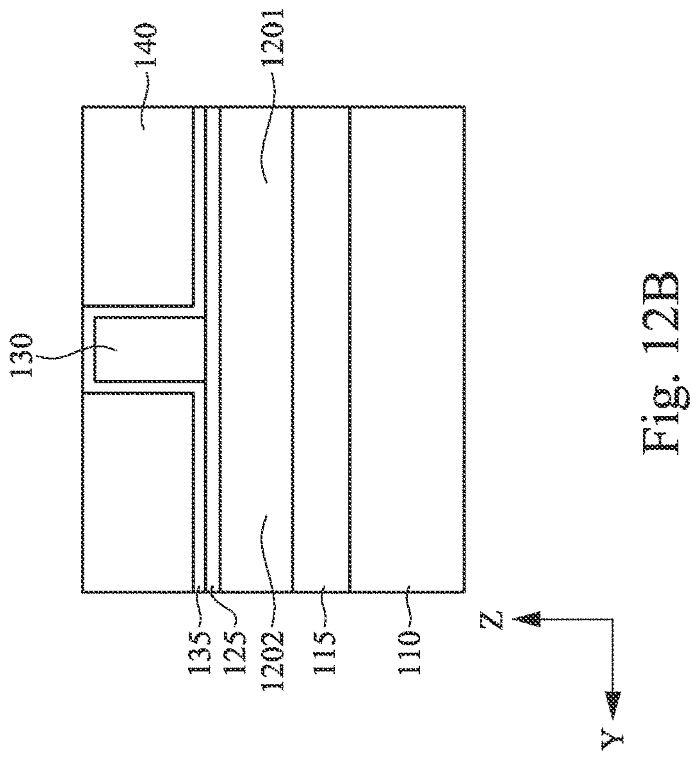
FIGS. 12A-12C illustrate forming a second interlayer dielectric layer over the spacer layer in accordance with some embodiments.
Figure 12A:
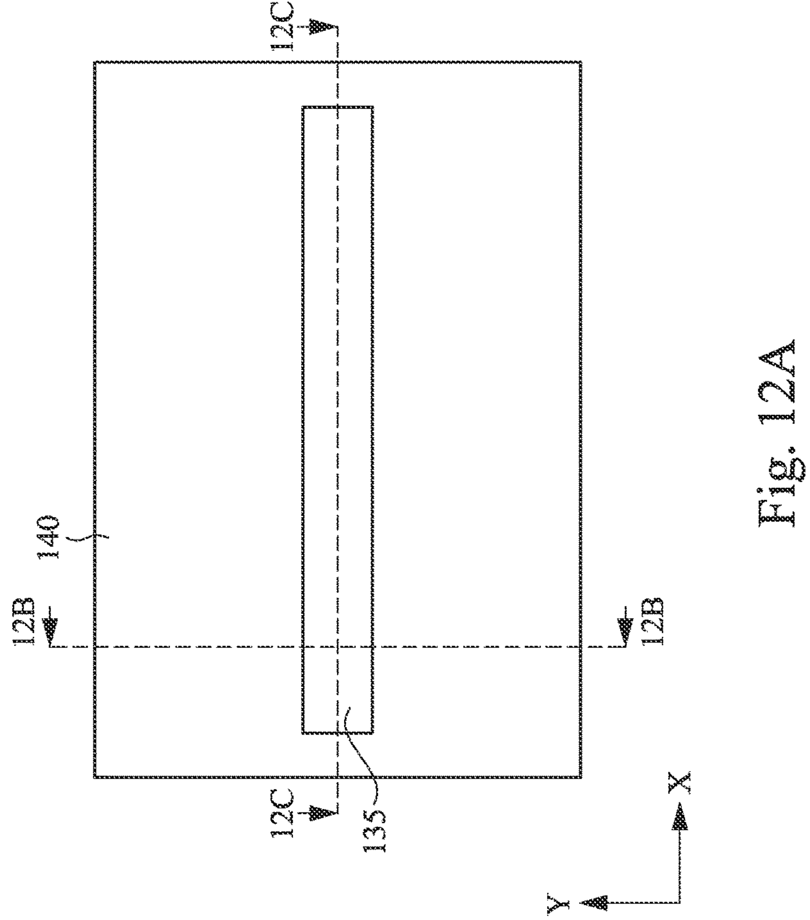
Figure 12C:
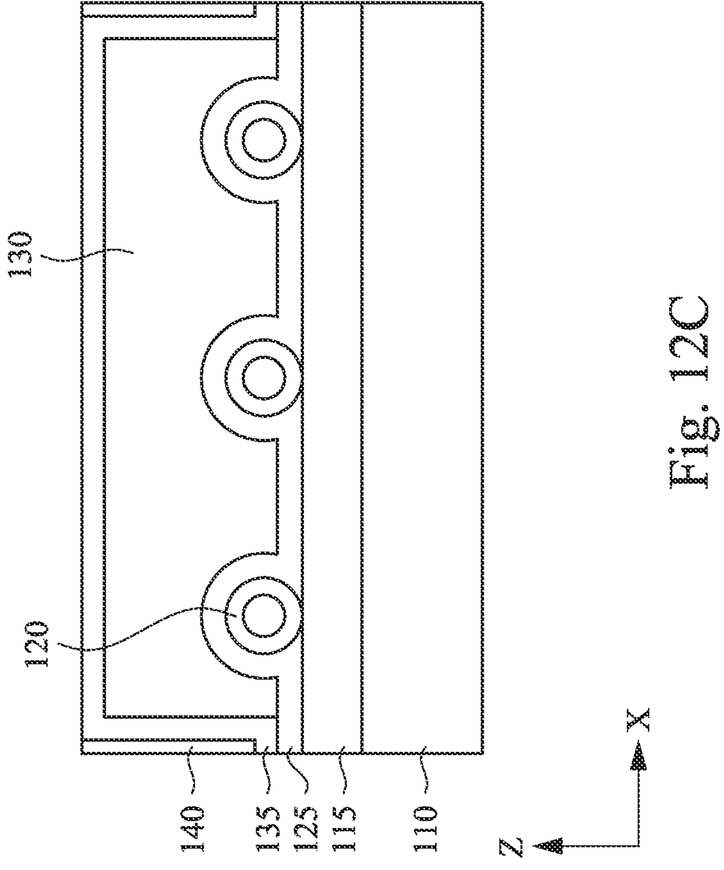

Reference is made to FIGS. 12A-12C and 18. In operation 206, a second interlayer dielectric layer 140 is formed over the spacer layer 135. FIGS. 12A-12C illustrate forming a second interlayer dielectric layer 140 over the spacer layer 135 in accordance with some embodiments, wherein FIG. 12A illustrates a top view and FIGS. 12B and 12C illustrates cross-section views of FIG. 12A.

In one or more embodiments the second interlayer dielectric layer 140 is a dielectric material such as silicon oxide, aluminum oxide, combinations of these, or the like deposited onto the substrate 110 using a deposition process such as chemical vapor deposition, sputtering, atomic layer deposition, combinations of these, or the like. In one or more embodiments of the present disclosure, the interlayer dielectric layer 115 can be kinds of oxide or nitride such as $SiO_2$, $HfO_2$, $Al_2O_3$, SiN, α-BN, etc. However, any suitable material and any suitable deposition process may be utilized.

Additionally, while FIGS. 12A-12C illustrate the second interlayer dielectric layer 140 as being directly on and in physical contact with the spacer layer 135, this is intended to be illustrative and is not intended to be limiting. Rather, other dielectric materials and other substrate materials (e.g., silicon, germanium, gallium arsenide, combinations of these, or the like) may also be present between the second interlayer dielectric layer 140 and the spacer layer 135. All such combinations of layers may be used, and all are fully intended to be included within the scope of the embodiments.

Figure 13B:
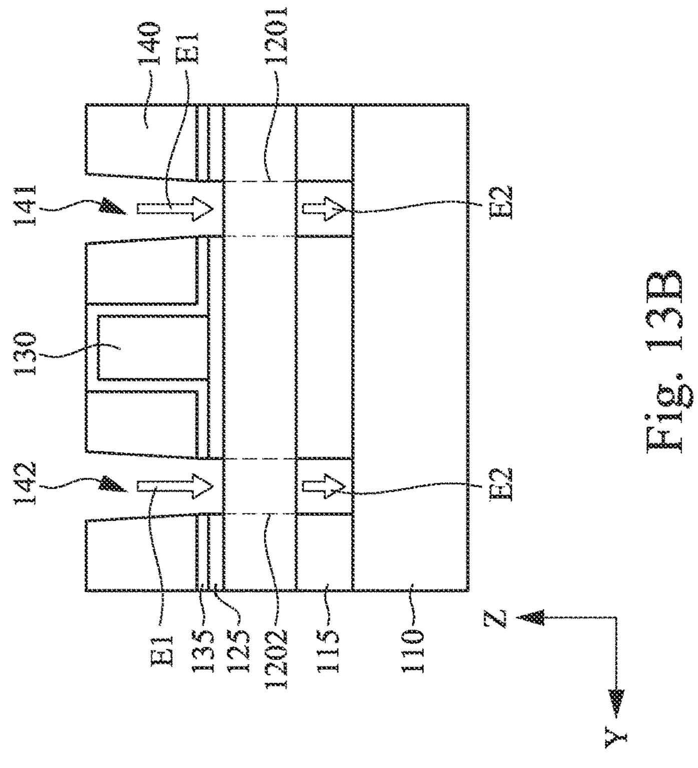
FIGS. 13A-13D illustrate etching the second interlayer dielectric layer, the spacer layer, the etch stop layer and the first interlayer dialectic layer to form contact holes extending to the substrate in accordance with some embodiments.
Figure 13A:
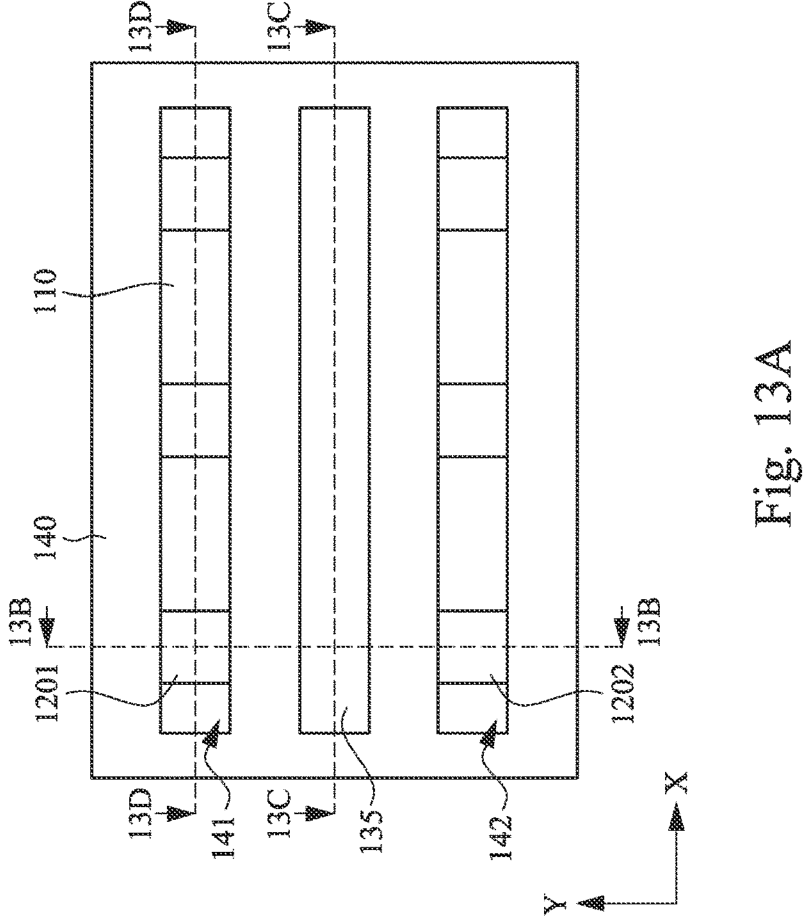
Figure 13D:
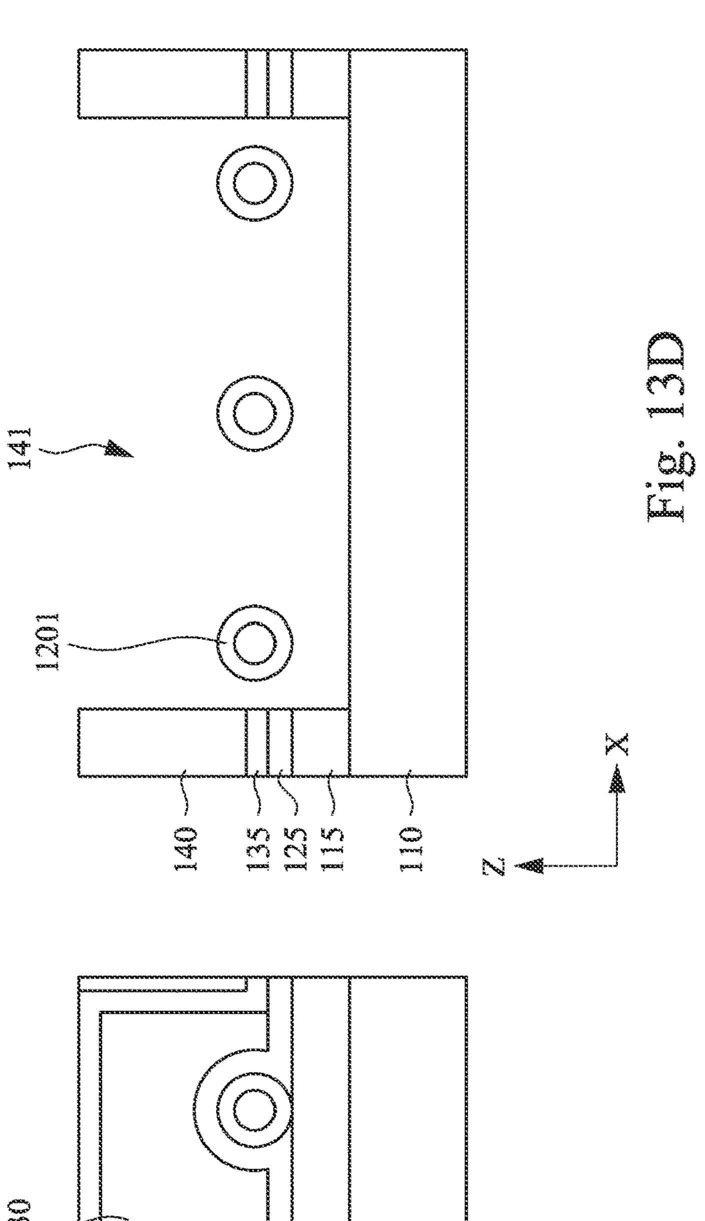
Figure 13C:
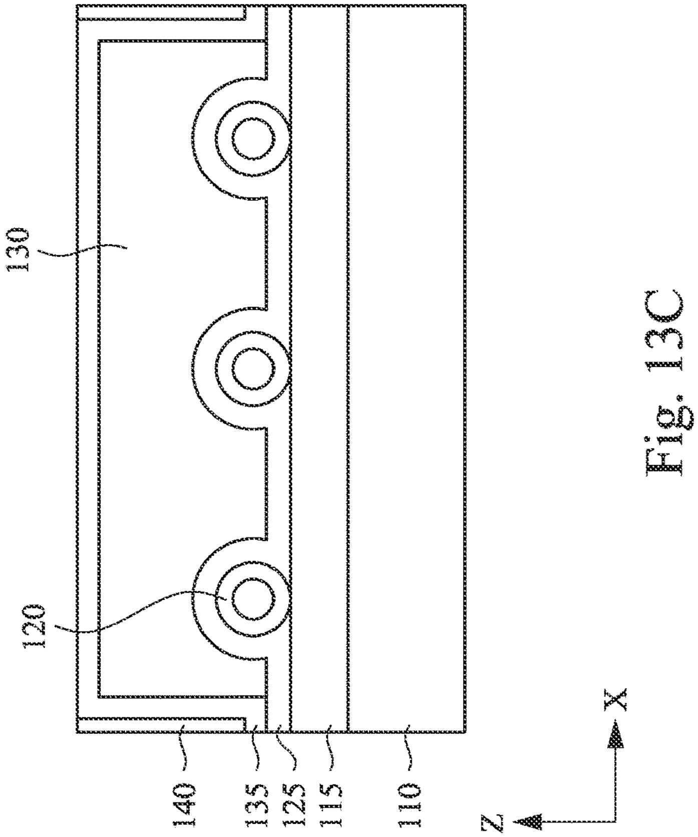

Reference is made to FIGS. 13A-13D and 18. In operation 207, contact holes 141 and 142 are formed through the ILD layer 140. FIGS. 13A-13D illustrate etching the second interlayer dielectric layer 140, the spacer layer 135, the etch stop layer 125 and the first interlayer dielectric layer 115 to form contact holes 141 and 142 extending to the substrate 110 along the direction z in accordance with some embodiments, wherein FIG. 13A illustrates a top view and FIGS. 13B, 13C and 13D illustrates cross-section views of FIG. 13A.

As shown in FIGS. 13A-13D, in one or more embodiments of the present disclosure, the contact hole 141 is formed at the first source/drain regions 1201 of the CNTs 120, and the contact hole 142 is formed at the second source/drain regions 1202. The contact hole 141 exposes the first source/drain regions 1201 of the CNTs 120 and the contact hole 142 exposes the second source/drain regions 1202 of the CNTs 120. In one or more embodiments, the formation of the contact holes 141 and 142 includes a first etching process E1 and a second etching process E2.

For example, in the embodiment as illustrated in FIGS. 13A-13D of the present disclosure, the first etching process E1 is to etch the second interlayer dielectric layer 140 and the spacer layer 135 at the first source/drain regions 1201 and second source/drain regions 1202 of the CNTs 120 and stop at the first interlayer dielectric layer 115 under the etch stop layer 125, and the contact holes 141 and 142 extending to the first interlayer dielectric layer 115 are provided. The first etching process E1 stopping at the first interlayer dielectric layer 115 exposes the upper side surfaces of the first source/drain regions 1201 and the second source/drain regions 1202 of the CNTs 120. Then, the second etching process E2 is to further etch the first interlayer dielectric layer 115 from the contact holes 141 and 142 and stop at the substrate 110 such that the contact holes 141 and 142 extend to the substrate 110. The second etching process E2 stopping at the substrate 110 expose the upper side surface of the first source/drain regions 1201 and the second source/drain regions 1202 of the CNTs 120. Accordingly, following operation 207, the first source/drain regions 1201 and the second source/drain regions 1202 are floated from the substrate 110 in the contact holes 141 and 142, respectively. The floating first source/drain regions 1201 and second source/drain regions 1202 of the CNTs 120 have great contact area in contact with the band-edge shift inducing layers 1451 and 1452.

In some embodiments, the formation of the contact holes 141 and 142 can only include the first etching process E1 stopping at the first interlayer dielectric layer 115. In some embodiments, the formation of the contact holes 141 and 142 can include the first etching process E1 stopping at the first interlayer dielectric layer 115 and the second etching process E2 stopping at a middle of the interlayer dielectric layer 115 and not extending to the top surface of the substrate 110, so that the first source/drain regions 1201 and second source/drain regions 1202 are floated from the first interlayer dielectric layer 115 by the contact holes 141 and 142, respectively. For details, please refer to following discussion.

In some embodiments of the present disclosure, the first etching process E1 etching the second interlayer dielectric layer 140 the spacer layer 135 and stopping at the first interlayer dielectric layer 115 can include dry etching and/or plasma etching. In some embodiments of the present disclosure, the second etching process E2 etching the first interlayer dielectric layer 115 can include wet etching. In some embodiments, the second etching process E2 can be skipped such that the contact holes 141 and 142 do not extend into the first ILD layer 115, and thus the resultant band-edge shift inducing layers 1451 and 1452 do not extend into the first ILD layer 115, resulting in the structure as illustrated in FIGS. 3A-3C or FIGS. 4A-4B. In some embodiments, the timing of the second etching process E2 can be controlled such that the contact holes 141 and 142 do not extend through a full thickness of the first ILD layer 115, and thus the resultant band-edge shift inducing layers 1451 and 1452 do not extend through a full thickness of the first ILD layer 115, resulting in the structure as illustrated in FIGS. 5A-5B.

Figure 14B:
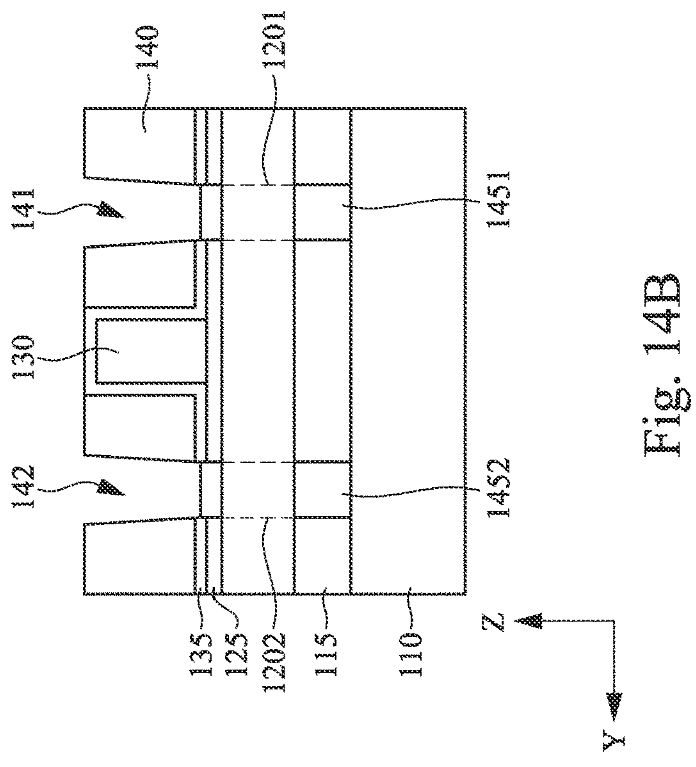
FIGS. 14A-14D illustrate forming band-edge shift inducing layer s in the contact hole in accordance with some embodiments.
Figure 14A:
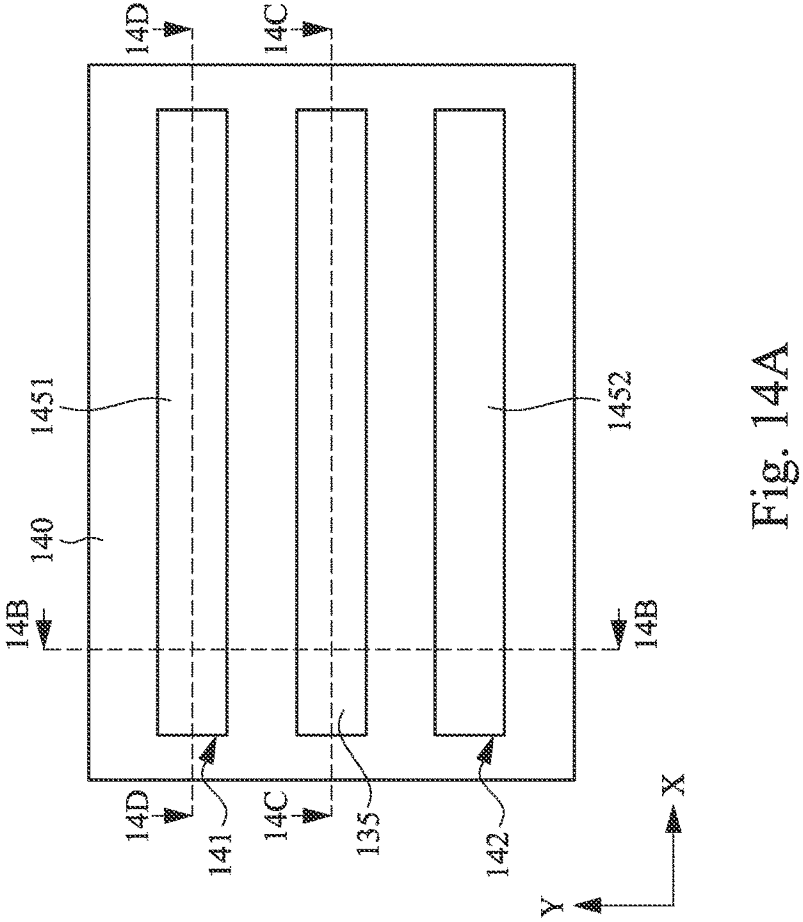
Figure 14D:
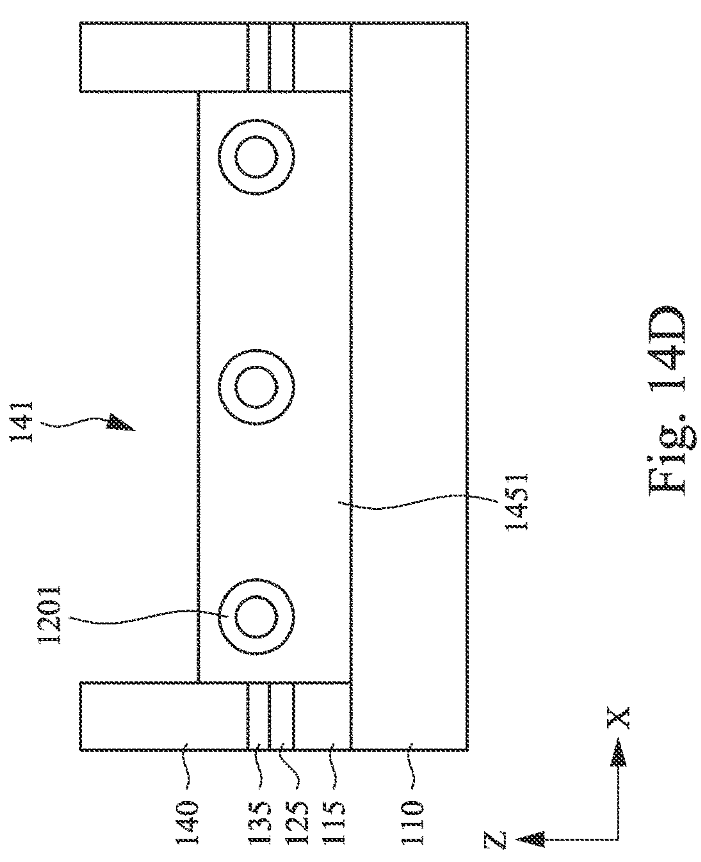
Figure 14C:
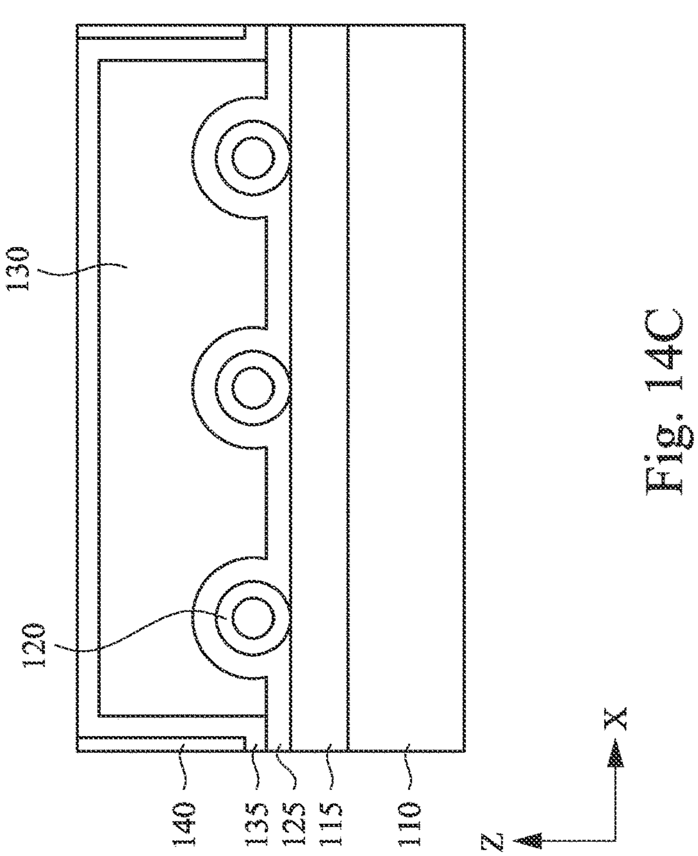

Reference is made to FIGS. 14A-14D and 18. In operation 208, band-edge shift inducing layers 1451 and 1452 are formed in the contact holes 141 and 142 and in contact with the CNTs 120. FIGS. 14A-14D illustrate forming band-edge shift inducing layers 1451 and 1452 in the contact holes 141 and 142, respectively, in accordance with some embodiments, wherein FIG. 14A illustrates a top view and FIGS. 14B, 14C and 14D illustrates cross-section views of FIG. 13A.

In the embodiment as illustrated in FIGS. 14A-14D, the band-edge shift inducing layers 1451 and 1452 are filled with the contact holes 141 and 142, respectively. The band-edge shift inducing layer 1451 is formed over and surrounds the first source/drain regions 1201 of the CNTs 120 in the contact hole 141. The band-edge shift inducing layer 1452 is formed over and surrounds the second source/drain regions 1201 of the CNTs 120 in the contact hole 142. In one or more embodiments of the present disclosure, the band-edge shift inducing layers 1451 and 1452 are respectively formed in the contact holes 141 and 142 by depositing process, e.g., atomic layer depositing (ALD) process or CVD process, until the contact holes 141 and 142 are overfilled with the materials of the band-edge shift inducing layers 1451 and 1452. Then, the materials of the band-edge shift inducing layers 1451 and 1452 are etched back to fall below a top surface of the ILD layer 140, by using a selective etch back process. In the embodiment as illustrated in FIGS. 14A-14D, the top surfaces of the band-edge shift inducing layers 1451 and 1452 are higher than the CNTs 120 in the contact holes 141 and 142. The top surfaces of the band-edge shift inducing layers 1451 and 1452 can be controlled by the selective etch back process performed on the band-edge shift inducing layers 1451 and 1452. For example, the selective etch back process time can be controlled such that the top surfaces of the band-edge shift inducing layers 1451 and 1452 fall below top surfaces of the CNTs 120, resulting in structures as illustrated in FIGS. 2A-2C and FIGS. 4A-4B.

Figure 15B:
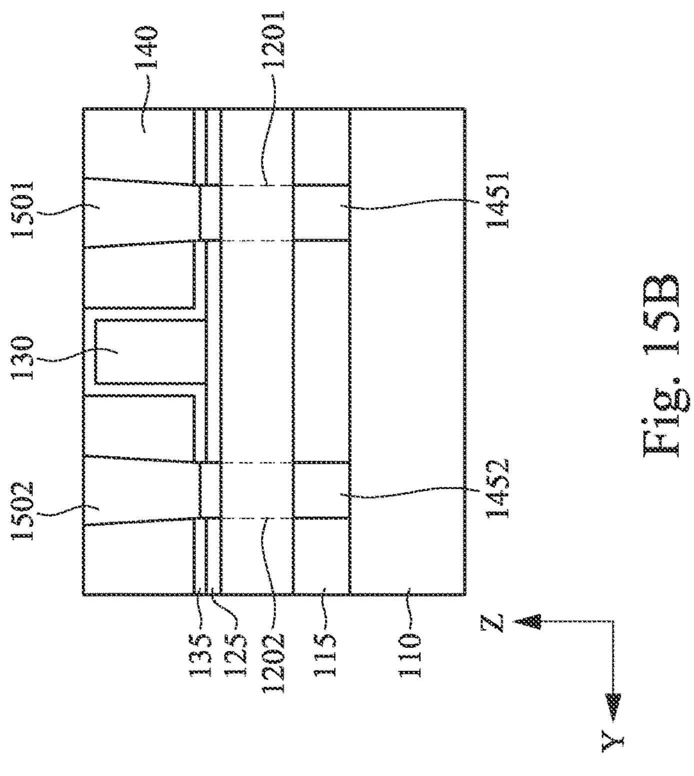
FIGS. 15A-15D illustrate forming contact layers over the c band-edge shift inducing layers in accordance with some embodiments.
Figure 15A:
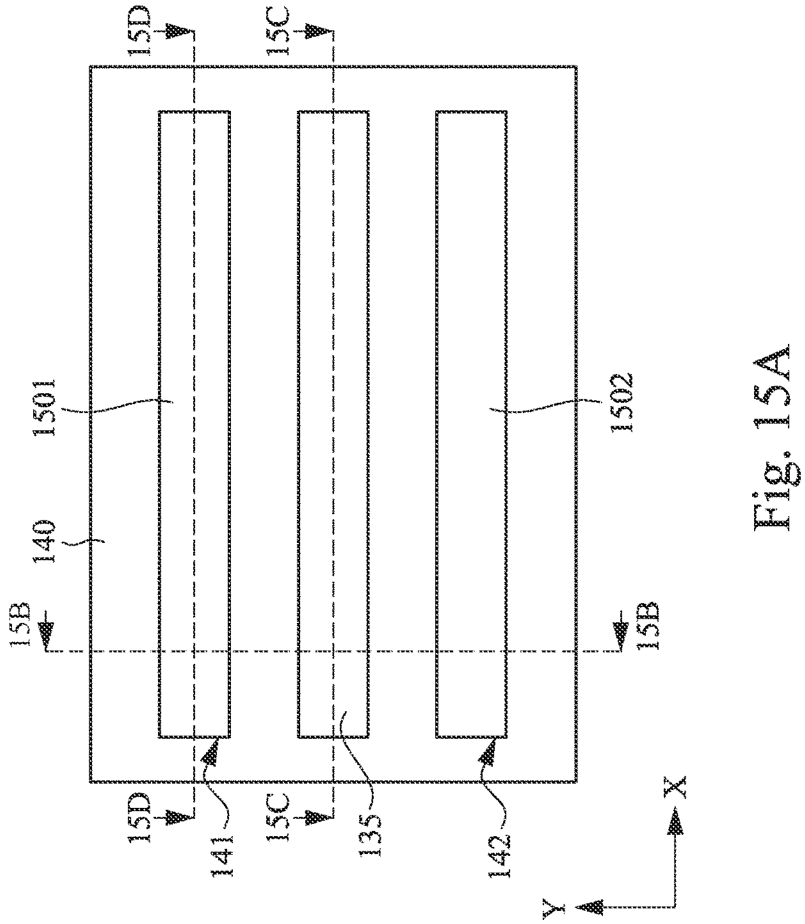
Figure 15D:
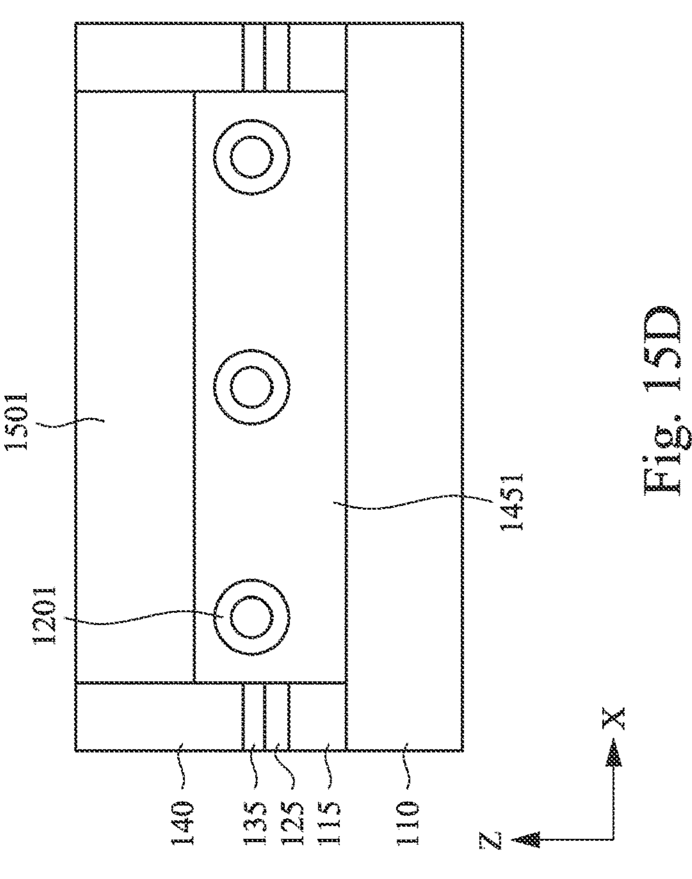
Figure 15C:
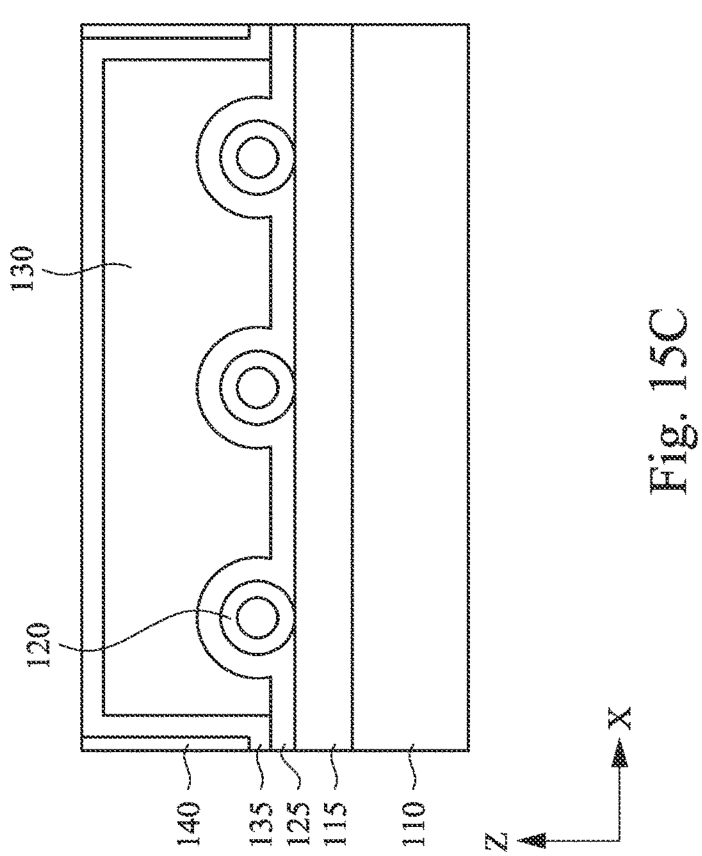

Reference is made to FIGS. 15A-15D and 18. In operation 209, contact layers 1501 and 1502 over the band-edge shift inducing layers 1451 and 1452. FIGS. 15A-15D illustrate forming contact layers 1501 and 1502 over the band-edge shift inducing layers 1451 and 1452, respectively, in accordance with some embodiments, wherein FIG. 15A illustrates a top view and FIGS. 15B, 15C and 15D illustrates cross-section views of FIG. 15A.

In the embodiment as illustrated in FIGS. 15A-15D of the present disclosure, the contact layers 1501 and 1502 are respectively formed in the contact holes 141 and 142. In accordance with some embodiments, the formation of the contact layers 1501 and 1502 includes depositing one or more metal materials in the contact holes 141 and 142 until the contact holes 141 and 142 are overfilled, followed by performing a chemical mechanical planarization (CMP) process to remove excess portions of the one or more metal materials outside the contact holes 141 and 142.

Figure 16B:
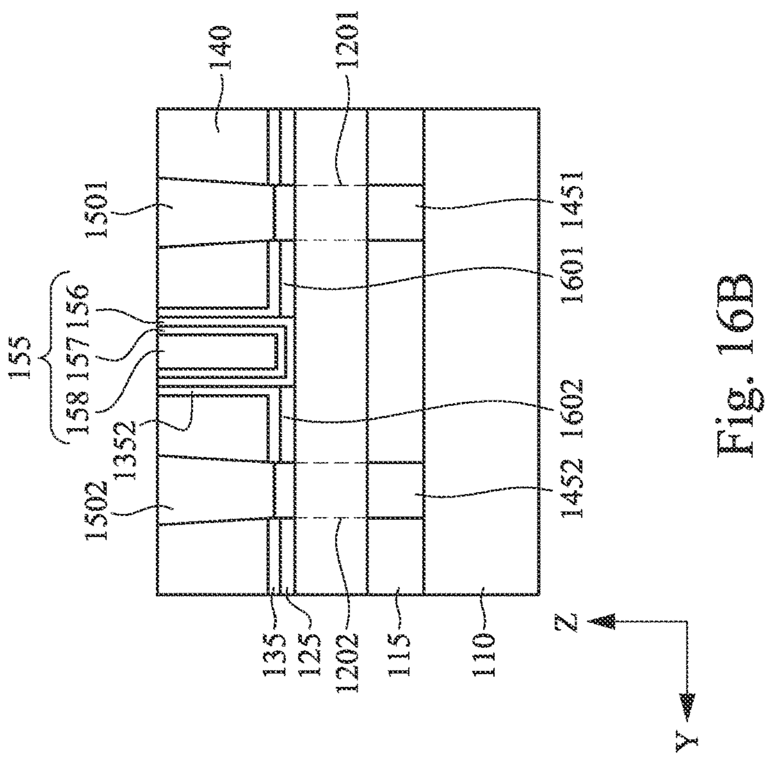
FIGS. 16A-16D illustrate replacing the dummy gate by a gate structure in accordance with some embodiments.
Figure 16A:
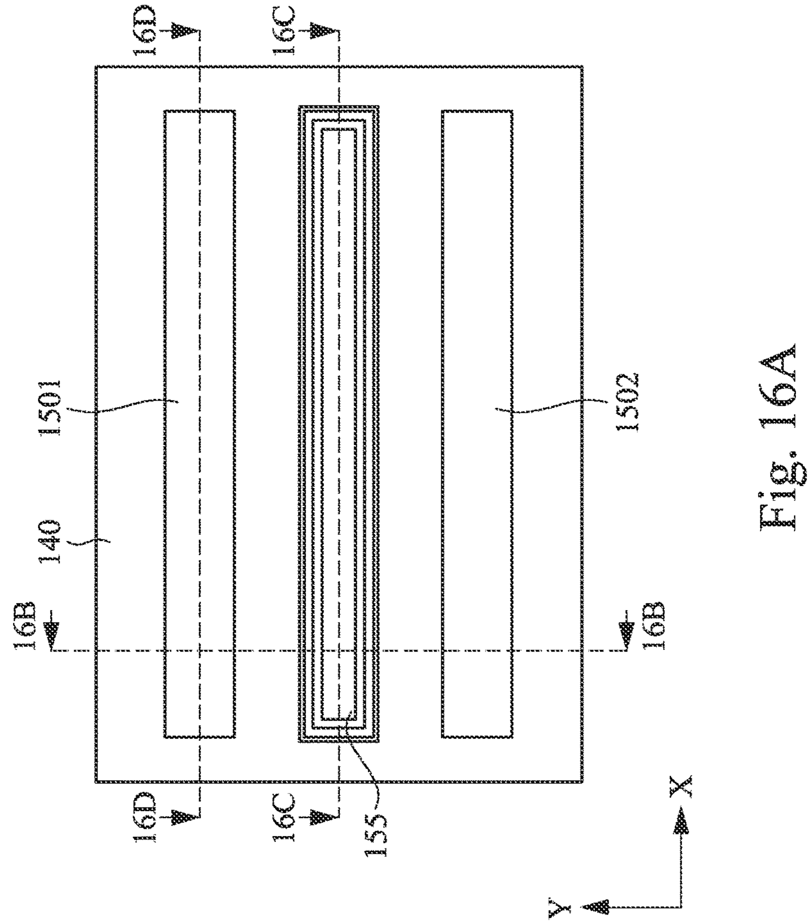
Figure 16D:
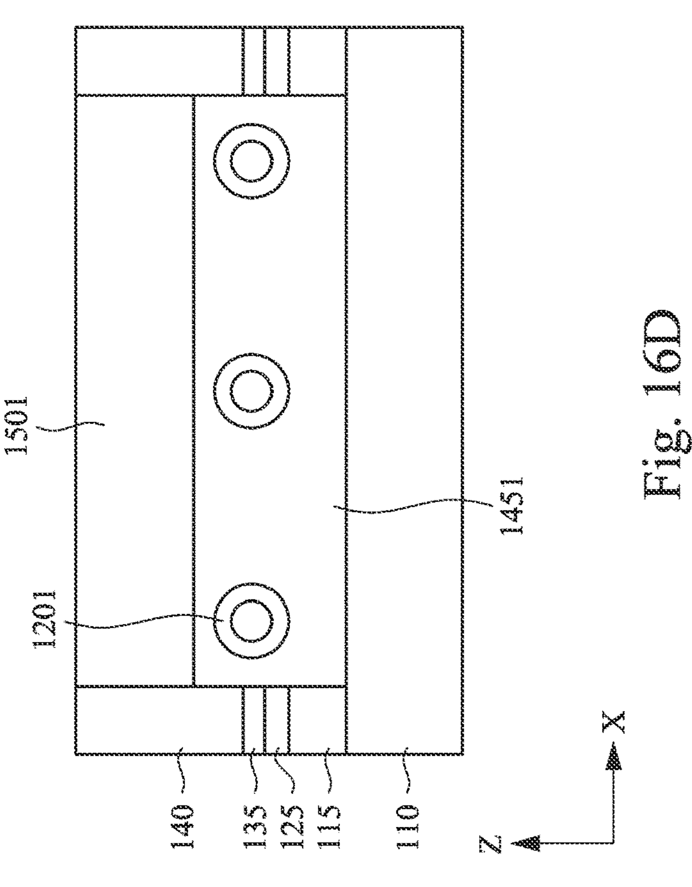
Figure 16C:
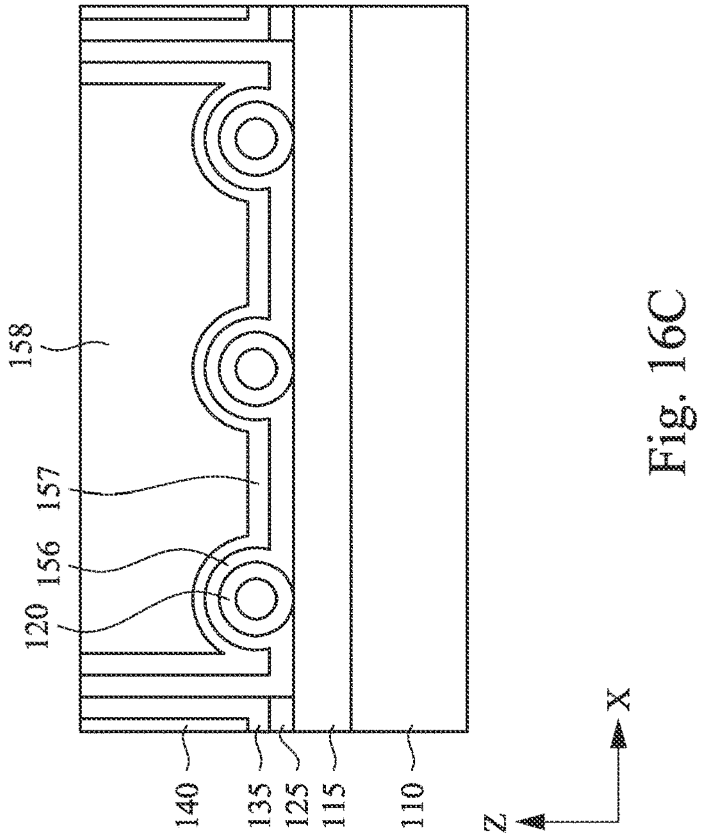
Figure 17B:
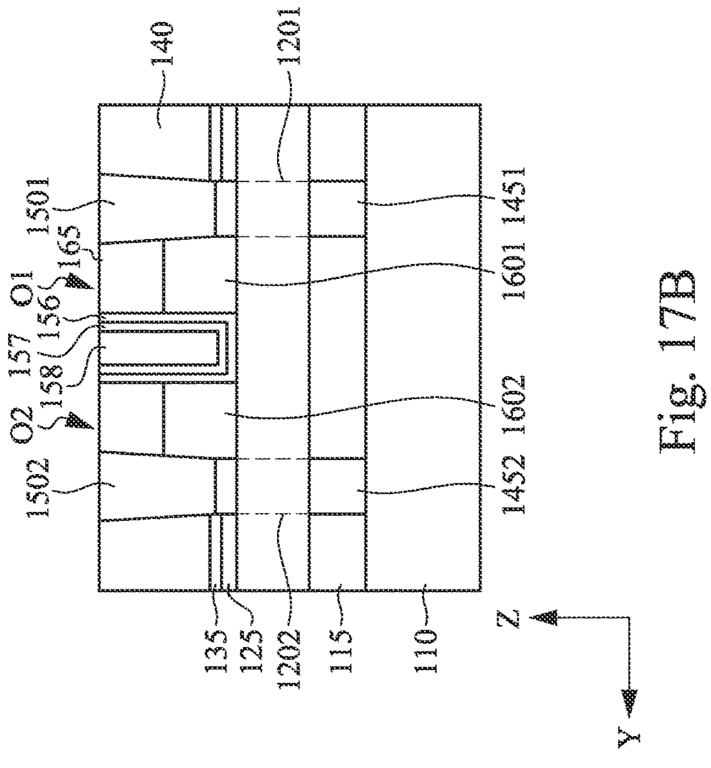
FIGS. 17A-17D illustrate forming auxiliary band-edge shift inducing layers in accordance with some embodiments.
Figure 17A:
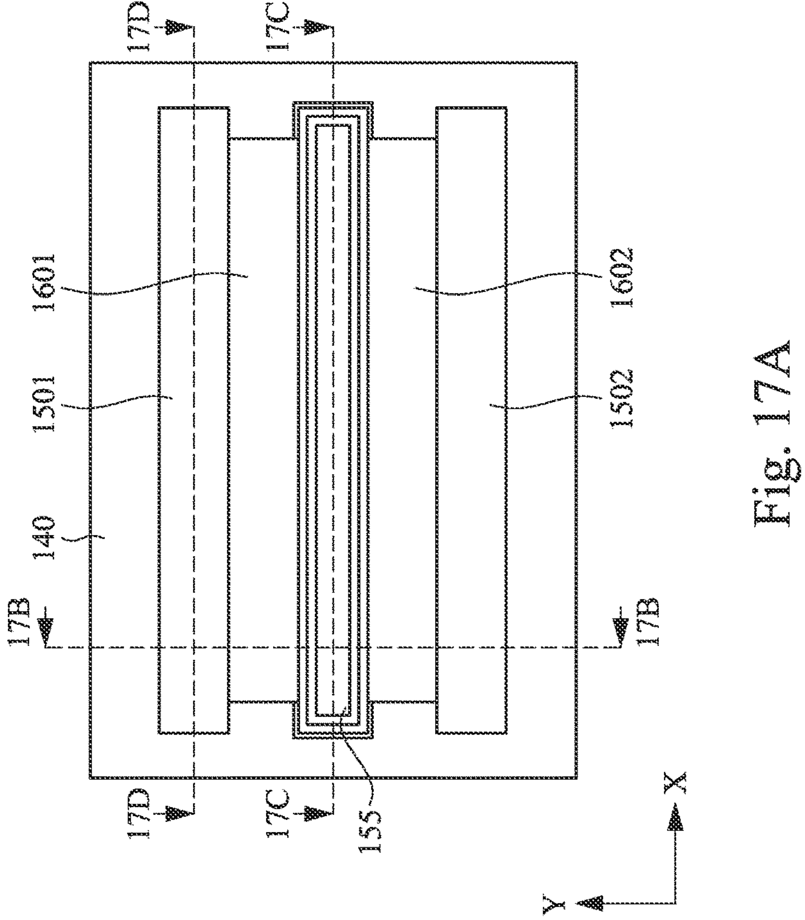
Figure 17D:
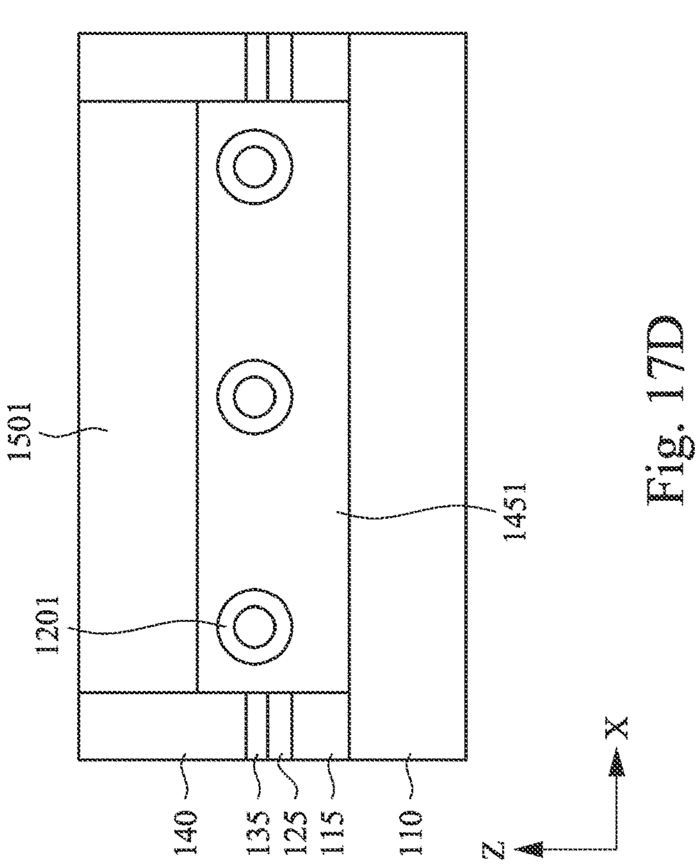
Figure 17C:
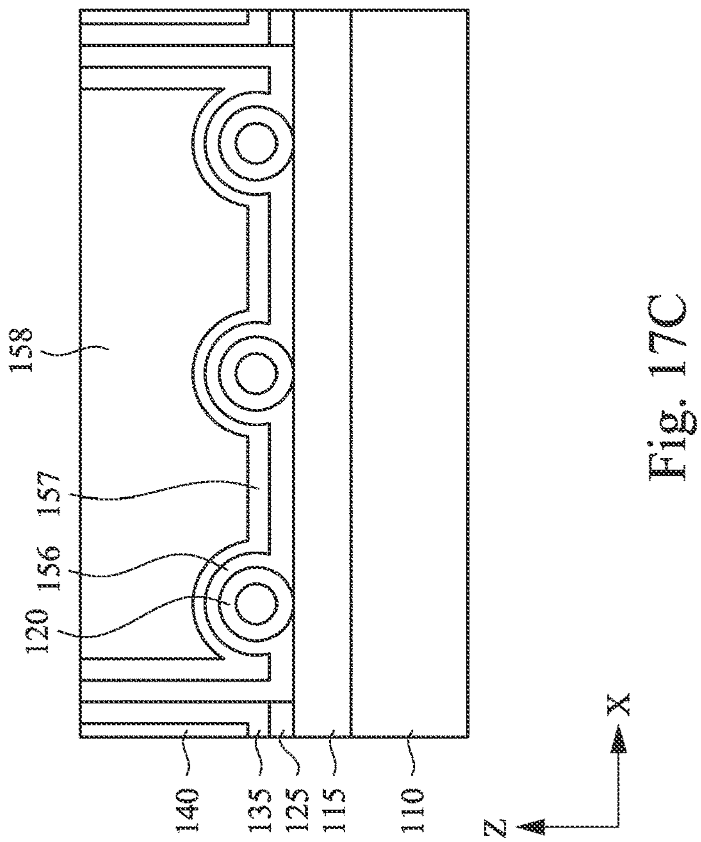

Reference is made to FIGS. 16A-16D and 18. In operation 210, the dummy gate 130 is replaced by a gate structure 155. FIGS. 16A-16D illustrate replacing the dummy gate 130 by a gate structure 155 in accordance with some embodiments, wherein FIG. 16A illustrates a top view and FIGS. 16B, 16C and 16D illustrates cross-section views of FIG. 16A. In the embodiment as illustrated in FIGS. 16A, 16B, 16C and 16D, the gate structure 155 includes gate dielectric layers 156, 157 and a gate electrode 158. In one or more embodiments of the present disclosure, the gate structure 155 can include one or more gate dielectric layers.

In some embodiments, the gate dielectric layers 156 and 157 include a high-k dielectric material, such as a metal oxide or a silicate of hafnium, aluminum, zirconium, lanthanum, manganese, barium, titanium, lead, and combinations thereof. The gate dielectric layers 156 and 157 may include a dielectric layer having a k value greater than about 7.0. The formation methods of the gate dielectric layers 156 and 157 may include depositing a gate dielectric layer through a deposition process such as Molecular-Beam Deposition (MBD), ALD, PECVD, and the like. However, any suitable materials and methods of manufacture may be utilized to deposit the material for the gate dielectric layers 156 and 157. For example, in one or more embodiments of the present disclosure, the gate dielectric layers 156 and 157 can includes kinds of oxide or nitride such as $SiO_x$, $HfO_x$, $AlO_x$, $YO_x$, $ScO_x$, $MoO_x$, $WO_x$, $VO_x$, $SiN_x$, $AlN_x$, $ScN_x$, etc.

The gate electrode 158 is formed over the gate dielectric layers 156 and 157. In one or more embodiments the gate electrode layer of the gate electrode 158 includes Pd, Pt, Au, Sc, Y, W, Ti, TiN, etc. In one or more embodiments the gate electrode layer of the gate electrode 158 may be deposited by chemical vapor deposition (CVD), sputter deposition, or the like. In some embodiments, the gate structure 155 is formed by first removing the dummy gate 130 and a portion of the spacer layer 135 atop the dummy gate 130 to form a gate trench between gate spacers 1352, followed by depositing the first high-k gate dielectric layer 156, the second high-k gate dielectric layer 157, and one or more metal layers of the gate electrode 158 into the gate trench, and followed by performing a CMP process on the one or more metal layers of the gate electrode 158, the second high-k gate dielectric layer 157 and the first high-k gate dielectric layer 156, until the ILD layer 140 is exposed.

Reference is made to FIGS. 17A-17D and 18. In operation 211, the gate spacers 1352, and other materials between the gate structure 155 and the corresponding contact layers 1501/1502 are removed to form openings O1 and O2, exposing the source/drain extension regions of the CNTs 120. Next, the auxiliary band-edge shift inducing layers 1601, 1602 are formed in the openings O1 and O2 by depositing the material of the auxiliary band-edge shift inducing layers 1601, 1602 in the openings O1 and O2, followed by etching back the material of the auxiliary band-edge shift inducing layers 1601, 1602 such that top surfaces of the auxiliary band-edge shift inducing layers 1601, 1602 fall below the ILD layer 140. Next, another ILD layer 165 (not illustrated in FIG. 17A for the purpose of simple description) is formed over the auxiliary band-edge shift inducing layers 1601, 1602 by depositing a dielectric material overfilling the openings O1 and O2, followed by performing a CMP process on the dielectric material until the ILD layer 140 is exposed.

Figure 19:
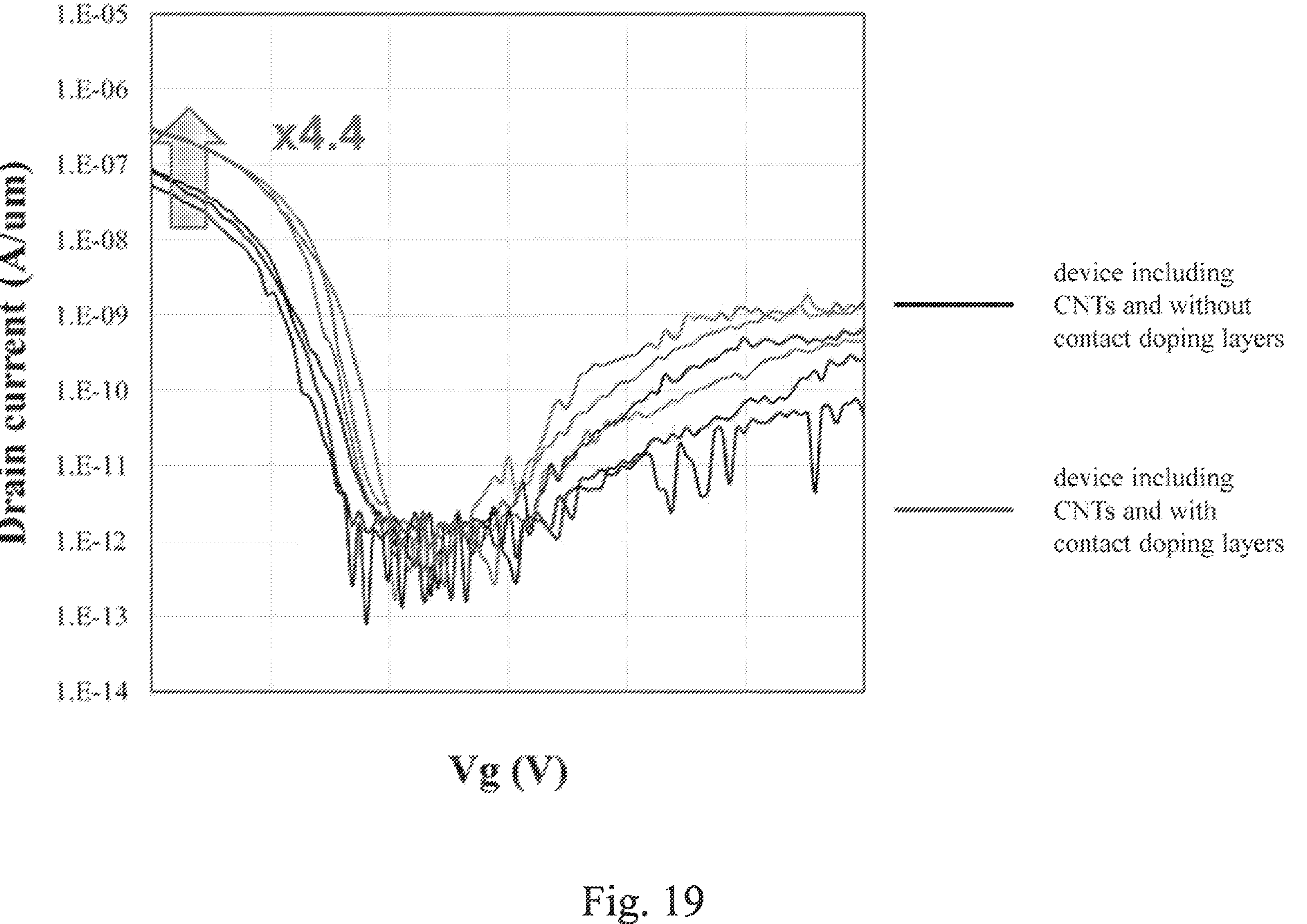
FIG. 19 illustrates I-V curves of devices with or without contact doping layers in accordance with some embodiments.

FIG. 19 illustrates I-V curves of devices with or without band-edge shift inducing layers in accordance with some embodiments. The horizontal axis of FIG. 19 presents gate voltage. The vertical axis of FIG. 19 presents drain current in unit A/μm. The black line presents I-V curve of a device including CNTs and without band-edge shift inducing layers. The ash line presents I-V curve of a device including CNTs and band-edge shift inducing layers in accordance with some embodiments of the present disclosure. As shown in FIG. 19, the drain current of the device with the band-edge shift inducing layers are obviously greater than the drain current to the device without the band-edge shift inducing layers.

According to one or more embodiments of the present disclosure, a device includes a substrate, a carbon nanotube over the substrate having source/drain regions and a channel region between the source/drain regions, band-edge shift inducing layers respectively in contact with the source/drain regions of the carbon nanotube and a gate structure over the channel region of the carbon nanotube. Valence bands in the source/drain regions of the carbon nanotube are shifted from valence band edges in the channel region of the carbon nanotube. In one or more embodiments of the present disclosure, the band-edge shift inducing layers are metal oxide layers. In one or more embodiments of the present disclosure, the source/drain regions of the carbon nanotube are surrounded by the band-edge shift inducing layers. In one or more embodiments of the present disclosure, the band-edge shift inducing layers are metal oxide layers has a work function greater than 5 eV. In one or more embodiments of the present disclosure, the band-edge shift inducing layers are metal oxide layers has a work function less than 5 eV. In one or more embodiments of the present disclosure, the source/drain regions of the carbon nanotube are free of dopants. In one or more embodiments of the present disclosure, the device further includes a metal contact over the band-edge shift inducing layer. In one or more embodiments of the present disclosure, the device further includes an auxiliary band-edge shift inducing layer in contact with a source/drain extension region of the carbon nanotube. The source/drain extension region is between the channel region and one of the source/drain regions. In some embodiments of the present disclosure, the auxiliary band-edge shift inducing layer is a metal oxide layer.

According to one or more embodiments of the present disclosure, a device includes a carbon nanotube having a channel region and dopant-free source/drain regions at opposite sides of the channel region, a first metal oxide layer interfacing a first one of the dopant-free source/drain regions of the carbon nanotube, a second metal oxide layer interfacing a second one of the dopant-free source/drain regions of the carbon nanotube and a gate structure over the channel region of the carbon nanotube, and laterally between the first metal oxide layer and the second metal oxide layer. In one or more embodiments of the present disclosure, the dopant-free source/drain regions have p-type behavior induced by the first metal oxide layer and the second metal oxide layer. In one or more embodiments of the present disclosure, the dopant-free source/drain regions have n-type behavior induced by the first metal oxide layer and the second metal oxide layer. In one or more embodiments of the present disclosure, the first metal oxide layer and the second metal oxide layer have a work function greater than 5 eV. In one or more embodiments of the present disclosure, the first metal oxide layer and the second metal oxide layer have a work function less than 5 eV. In one or more embodiments of the present disclosure, the device further includes a first metal contact over the first metal oxide layer and a second metal contact over the second metal oxide layer. In some embodiments of the present disclosure, the first metal contact and the second metal contact are in contact with the dopant-free source/drain regions of the carbon nanotube, respectively.

According to one or more embodiments of the present disclosure, a method includes forming a carbon nanotube over a substrate; forming a first metal oxide layer over and a second metal oxide layer over source/drain regions of the carbon nanotube; and forming a gate structure over a channel region of the carbon nanotube and between the first metal oxide layer and the second metal oxide layer. In one or more embodiments of the present disclosure, the method further includes forming an interlayer dielectric (ILD) layer over the carbon nanotube and etching the ILD layer to form contact holes exposing the source/drain regions of the carbon nanotube, wherein the first metal oxide layer and the second metal oxide layer are formed in the contact holes. In some embodiments of the present disclosure, the first metal oxide layer and the second metal oxide layer have top surfaces lower than a top surface of the ILD layer. In one or more embodiments of the present disclosure, the method further includes forming an auxiliary band-edge shift inducing layer over a source/drain extension region of the carbon nanotube, wherein the source/drain extension region is between the channel region and one of the source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a substrate;

a carbon nanotube over the substrate having source/drain regions and a channel region between the source/drain regions;

band-edge shift inducing layers respectively in contact with the source/drain regions of the carbon nanotube, wherein valence bands in the source/drain regions of the carbon nanotube are shifted from valence band edges in the channel region of the carbon nanotube;

a gate structure over the channel region of the carbon nanotube; and an auxiliary band-edge shift inducing layer in contact with a source/drain extension region of the carbon nanotube, wherein the source/drain extension region is between the channel region and one of the source/drain regions.

2. The device of claim 1, wherein the band-edge shift inducing layers are metal oxide layers.

3. The device of claim 1, wherein the source/drain regions of the carbon nanotube are surrounded by the band-edge shift inducing layers.

4. The device of claim 1, wherein the band-edge shift inducing layers are metal oxide layers has a work function greater than 5 eV.

5. The device of claim 1, wherein the band-edge shift inducing layers are metal oxide layers has a work function less than 5 eV.

6. The device of claim 1, wherein the source/drain regions of the carbon nanotube are free of dopants.

7. The device of claim 1, further comprising:

a metal contact over the band-edge shift inducing layer.

8. The device of claim 1, wherein the auxiliary band-edge shift inducing layer is a metal oxide layer.

9. The device of claim 1, wherein the auxiliary band-edge shift inducing layer extends between one of the band-edge shift inducing layers and the gate structure in a cross-sectional view.

10. A device, comprising:

a carbon nanotube having a channel region and dopant-free source/drain regions at opposite sides of the channel region;

a first metal oxide layer interfacing a first one of the dopant-free source/drain regions of the carbon nanotube;

a second metal oxide layer interfacing a second one of the dopant-free source/drain regions of the carbon nanotube; and a gate structure over the channel region of the carbon nanotube, and laterally between the first metal oxide layer and the second metal oxide layer.

11. The device of claim 10, wherein the dopant-free source/drain regions have p-type behavior induced by the first metal oxide layer and the second metal oxide layer.

12. The device of claim 10, wherein the dopant-free source/drain regions have n-type behavior induced by the first metal oxide layer and the second metal oxide layer.

13. The device of claim 10, wherein the first metal oxide layer and the second metal oxide layer have a work function greater than 5 eV.

14. The device of claim 10, wherein the first metal oxide layer and the second metal oxide layer have a work function less than 5 eV.

15. The device of claim 10, further comprising:

a first metal contact over the first metal oxide layer; and a second metal contact over the second metal oxide layer.

16. The device of claim 15, wherein the first metal contact and the second metal contact are in contact with the dopant-free source/drain regions of the carbon nanotube, respectively.

17. A method, comprising:

forming a carbon nanotube over a substrate;

forming a first metal oxide layer over and a second metal oxide layer over source/drain regions of the carbon nanotube; and forming a gate structure over a channel region of the carbon nanotube and between the first metal oxide layer and the second metal oxide layer.

18. The method of claim 17, further comprising:

forming an interlayer dielectric (ILD) layer over the carbon nanotube; and etching the ILD layer to form contact holes exposing the source/drain regions of the carbon nanotube, wherein the first metal oxide layer and the second metal oxide layer are formed in the contact holes.

19. The method of claim 18, wherein the first metal oxide layer and the second metal oxide layer have top surfaces lower than a top surface of the ILD layer.

20. The method of claim 17, further comprising:

forming an auxiliary band-edge shift inducing layer over a source/drain extension region of the carbon nanotube, wherein the source/drain extension region is between the channel region and one of the source/drain regions.

* * * * *